(12) United States Patent
Chu et al.

(10) Patent No.: US 11,921,504 B1
(45) Date of Patent: Mar. 5, 2024

(54) VEHICLE CONTROLLER VALIDATION

(71) Applicant: Zoox, Inc., Foster City, CA (US)

(72) Inventors: Eric Yan Tin Chu, San Francisco, CA (US); Robert Jonathan Crane, Foster City, CA (US); John Connelly Kegelman, Foster City, CA (US); Deepan Subrahmanian Palguna, Foster City, CA (US); Prateek Chandresh Shah, San Francisco, CA (US); Xiaosi Zeng, Foster City, CA (US); Wentao Zhong, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 348 days.

(21) Appl. No.: 17/136,978

(22) Filed: Dec. 29, 2020

(51) Int. Cl.
| | |
|---|---|
| *G05D 1/00* | (2006.01) |
| *B60W 50/04* | (2006.01) |
| *B60W 50/06* | (2006.01) |
| *G06F 30/20* | (2020.01) |
| *G07C 5/08* | (2006.01) |
| *B60W 50/00* | (2006.01) |

(52) U.S. Cl.
CPC ........... *G05D 1/0088* (2013.01); *B60W 50/04* (2013.01); *B60W 50/06* (2013.01); *G06F 30/20* (2020.01); *G07C 5/0808* (2013.01); *B60W 2050/0083* (2013.01); *B60W 2510/10* (2013.01); *B60W 2520/06* (2013.01); *B60W 2520/10* (2013.01); *B60W 2520/105* (2013.01); *B60W 2520/12* (2013.01); *B60W 2520/125* (2013.01)

(58) Field of Classification Search
CPC ...... G05D 1/0088; G06F 30/20; B60W 50/04; B60W 50/06; B60W 2050/0083; B60W 2510/10; B60W 2520/10; B60W 2520/105; B60W 2520/12; B60W 2520/125; G07C 5/0808
See application file for complete search history.

(56) References Cited

U.S. PATENT DOCUMENTS

| | | | | |
|---|---|---|---|---|
| 5,020,619 | A | * | 6/1991 | Kanazawa ............. B62D 7/159 701/41 |
| 9,315,178 | B1 | * | 4/2016 | Ferguson .............. B60W 30/12 |
| 2019/0102158 | A1 | * | 4/2019 | Thanayankizil ...... H04W 8/245 |
| 2020/0134109 | A1 | * | 4/2020 | Lee ......................... G05B 17/02 |
| 2020/0239024 | A1 | * | 7/2020 | Srinivasan ........... G05D 1/0011 |

(Continued)

*Primary Examiner* — Tyler J Lee
*Assistant Examiner* — Yufeng Zhang
(74) *Attorney, Agent, or Firm* — Lee & Hayes P.C.

(57) ABSTRACT

Techniques for generating simulations to evaluate an update to a controller. The controller may be configured to control one or more functionalities of an autonomous and/or a semi-autonomous vehicle. A simulation computing system may receive a request to evaluate a first controller. The simulation computing system may generate a simulation based on data associated with a previous operation of the vehicle in an environment, the previous operation being controlled by a second controller (e.g., standard for evaluation, control version, etc.). The simulation computing device may cause the first controller to control a simulated vehicle in the simulation and may determine whether to validate the update to the controller based on a difference between first metrics associated with a control of the simulated vehicle by the first controller and second metrics associated with a control of the vehicle by the second controller.

20 Claims, 14 Drawing Sheets

(56) References Cited

U.S. PATENT DOCUMENTS

| | | | |
|---|---|---|---|
| 2021/0139026 A1* | 5/2021 | Phan | G01S 13/931 |
| 2021/0286924 A1* | 9/2021 | Wyrwas | G07C 5/085 |
| 2022/0198107 A1* | 6/2022 | Pedersen | G06F 11/36 |

* cited by examiner

VALIDATOR RESULTS

| PERFORMANCE ATTRIBUTE | COMPONENT | TRACKER | DEFINITION | 2WS v. 4WS VERSION A | 2WS v. 4WS VERSION B | SUMMARY |
|---|---|---|---|---|---|---|
| TRACKS | PERCEPTION | | DIFFERENCE IN NUMBER OF TRACKS | | | 0/648 DIFF |
| VELOCITY | PLANNER | | DIFFERENCE IN VELOCITIES | | | 224/648 DIFF |
| ACCELERATION | PLANNER | | DIFFERENCE IN ACCELERATIONS | | | 270/648 DIFF |
| ACCELERATION FOR ACTION REF | PLANNER | | DIFFERENCE IN ACTION REFERENCE ACCELERATIONS | | | 319/648 DIFF |
| ACCELERATION ERROR | PLANNER | | ERROR IN ACCELERATION | | | 248/648 DIFF |
| ACTIONS | PLANNER | | DIFFERENCE IN NUMBER OF DETERMINED ACTIONS | | | 3/648 DIFF |
| REFERENCES | PLANNER | | DIFFERENCE IN NUMBER OF DETERMINED REFERENCES | | | 2/648 DIFF |
| ACCELERATION FOR ACTION REF ERROR | PLANNER | | ERROR IN ACTION REFERENCE ACCELERATIONS | | | 291/648 DIFF |
| LEFT CORRIDOR | PLANNER | | ERROR IN CORRIDOR POINTS ON LEFT | | | 477/648 DIFF |
| RIGHT CORRIDOR | PLANNER | | ERROR IN CORRIDOR POINTS ON RIGHT | | | 480/648 DIFF |

FIG. 4

CONFIGURATION RESULTS
2 WHEEL STEERING VERSUS 4 WHEEL STEERING

| SCENARIO | LINKS | DECISION ERROR (M) | PROJECTED HEADING ERROR (DEG) | PROJECTED LATERAL ERROR (M) | PROJECTED VELOCITY VX ERROR (M/S) | NON-EXPECTED HEADING ERROR DIFF (DEG) |
|---|---|---|---|---|---|---|
| SELECTED SCENARIO 1 | LINK 1 | 0.06M | 2.15° | 0.40M | 0.03M/S | 6.03° |
| SELECTED SCENARIO 2 | LINK 2 | 0.05M | 0.24° | 0.38M | 0.02M/S | 2.28° |
| SELECTED SCENARIO 3 | LINK 3 | 0.01M | 0.13° | 0.01M | 0.01M/S | 0.13° |
| SELECTED SCENARIO 4 | LINK 4 | 0.50M | 6.05° | 2.20M | 0.08M/S | 7.44° |
| SELECTED SCENARIO 5 | LINK 5 | 0.01M | 0.12° | 0.02M | 0.03M/S | 0.21° |
| SELECTED SCENARIO 6 | LINK 6 | 0.02M | 0.09° | 0.05M | 0.04M/S | 0.10° |
| SELECTED SCENARIO 7 | LINK 7 | 0.04M | 0.20° | 0.04M | 0.03M/S | 0.11° |
| SELECTED SCENARIO 8 | LINK 8 | 0.01M | 3.15° | 0.14M | 0.07M/S | 4.19° |
| SELECTED SCENARIO 9 | LINK 9 | 0.03M | 1.13° | 0.12M | 0.03M/S | 1.13° |
| SELECTED SCENARIO 10 | LINK 10 | 0.01M | 0.25° | 0.03M | 0.01M/S | 1.25° |

FIG. 9

VEHICLE CONTROLLER VALIDATION

BACKGROUND

Vehicles are increasingly supplementing or replacing manual functionality with automatic controls. Autonomous driving, however, requires computing systems capable of making split-second decisions to respond to myriad events and scenarios. The computing systems, such as the software and/or hardware associated therewith, may be updated, such as to optimize performance of vehicle and/or computing system operations. Prior to incorporating an update into a vehicle, the efficacy of the updated system may be confirmed via simulations, such as to evaluate a performance of the updated system as compared to a previous version. These simulations may test whether the updated system performs differently than the previous version. However, merely determining a difference in performance, such as a difference in determined trajectories, does not necessarily indicate whether the updated system constitutes an improvement over the previous version.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 4 is an example interface in which a summary of results of a performance evaluation associated with another autonomous controller may be displayed, in accordance with examples of this disclosure.

FIG. 9 is an example interface in which results of a performance evaluation of an autonomous controller in different configurations may be presented, the configurations including a two-wheel steering configuration and a four-wheel steering configuration, in accordance with examples of this disclosure.

DETAILED DESCRIPTION

Figure 1:
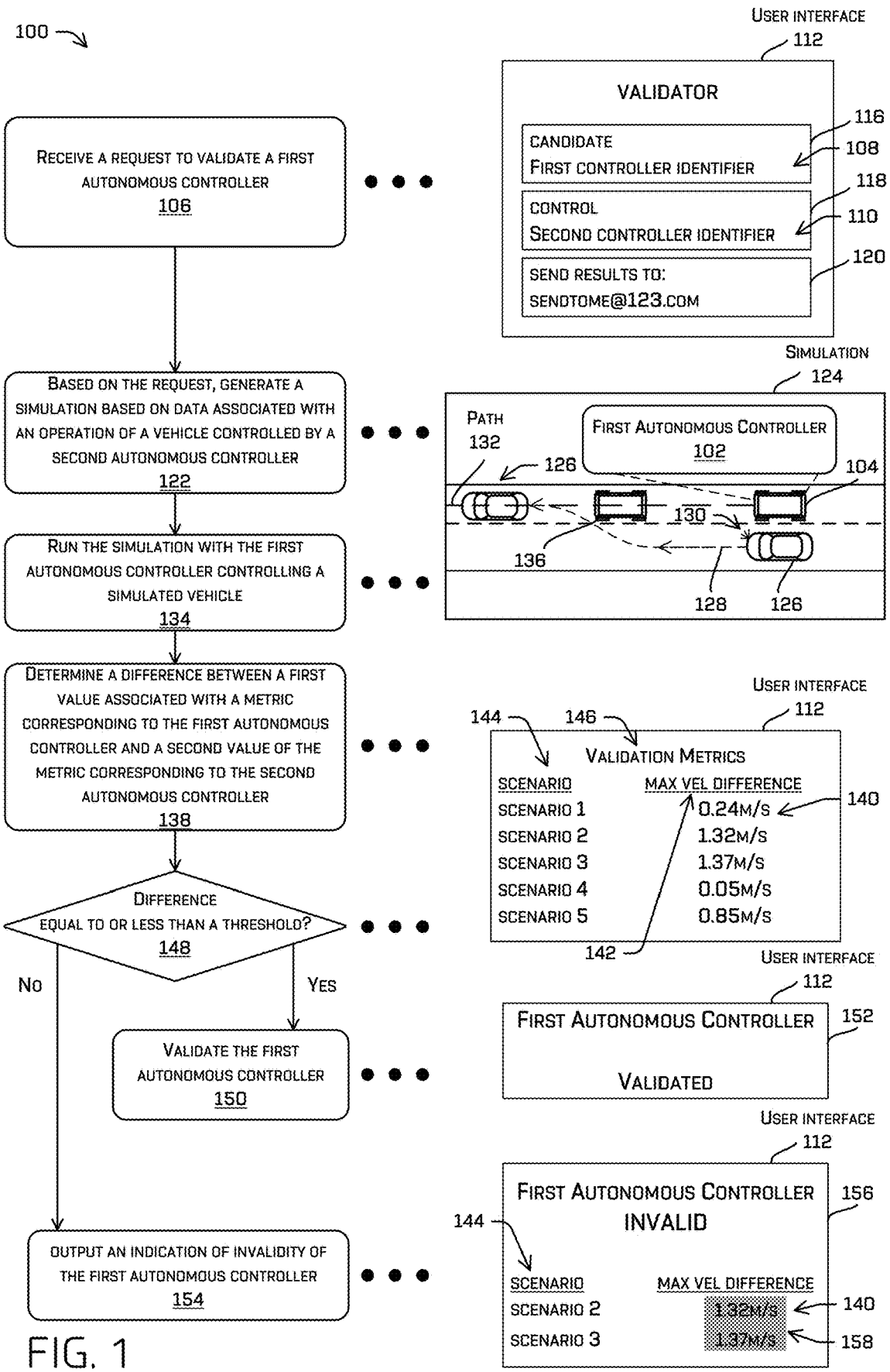
FIG. 1 illustrates an example process for validating an autonomous controller based on performance metrics associated therewith, in accordance with examples of this disclosure.

This disclosure is directed to techniques for generating simulations for evaluating an update to a controller. The controller may be configured to control one or more functionalities of an autonomous and/or a semi-autonomous vehicle. A simulation computing system may receive a request to validate an updated version of a controller (e.g., updated controller, first controller). The simulation computing system may generate a simulation based on data associated with a previous operation of the vehicle in an environment, the previous operation being controlled by the controller (e.g., original controller, standard for evaluation, control version, second controller, etc.). The simulation computing system may cause the updated controller to control a simulated vehicle in the simulation and may determine whether to validate the update to the controller based on a difference between first metrics associated with a control of the simulated vehicle by the updated controller and second metrics associated with a control of the vehicle by the previous or control version of the controller. Validating the updated controller confirms proper algorithmic behavior thereof and/or may be used as a probe to change programmatic logic, etc. For example, a software developer may update a controller with a non-behavioral code update, such as a code performance or compatibility update that is not intended to change a behavior of the controller in controlling the vehicle (e.g., movement, decision making process, etc.). A validation of the updated controller may ensure that the code update results in less than a threshold amount of change in the behavior of the vehicle as controlled by the updated controller. For another example, a software developer may update a particular subcomponent of the controller. A validation of the updated controller may ensure that the particular subcomponent, and not another subcomponent, exhibits the expected behavioral change. In some examples, responsive to determining that another subcomponent exhibits an unexpected change, the simulation computing system may determine that the other subcomponent may need to be updated.

In various examples, the simulation computing system may receive the request to validate the updated version of the controller via a user interface. The user interface may be associated with the simulation computing system and/or another computing device, such as a user computing device. In some examples, the user interface may be accessible via an application (e.g., web-based application, native application, etc.) through which the simulation computing system may receive the request. For example, a software developer may modify a code associated with a controller. The software developer may submit a request to validate the modified (e.g., updated) controller, such as to verify that the updated controller with the modified code will control the vehicle in substantially the same way as the previous version of the controller (e.g., unmodified).

In various examples, the simulation computing system may receive, via the user interface, an input corresponding to an updated controller or portion thereof to be tested (e.g., candidate) and/or a version of the controller to be used as a control (e.g., standard for evaluation). In such examples, the simulation computing system may determine the updated controller and the control version of the controller to use based on the user input. In various examples, the user input may include a unique identifier (e.g., secure hash function, etc.) associated with the updated controller and the control version of the controller. In such examples, the simulation computing system may identify the controllers to be used in the evaluation based on the unique identifier. In various examples, the simulation computing system may determine the control version based on a determination of a most recently updated version of the controller relative to the request.

In some examples, the simulation computing system may be configured to periodically (e.g., daily, weekly) evaluate updates to a controller, such as based on a validation schedule. In some examples, the simulation computing system may be configured to evaluate updates to a controller continuously or on an as-needed basis as updates become available. In some examples, an instruction to validate the first controller according to the validation schedule may be stored in a datastore associated with the simulation computing system. In such examples, the request may be generated based on the instruction. In various examples, the simulation computing system may validate an updated version of the controller by comparing a performance of thereof to a performance of an on-vehicle version of the controller (e.g., version that is currently associated with one or more vehicles). For example, a controller of a vehicle may be updated daily (or at any other desired frequency), such as by one or more software developers. The simulation computing system may have stored thereon an instruction to validate the updated controller prior to incorporating the updated controller into the vehicle. At or about a designated time (e.g., at night, during charging, during maintenance or service, during a period of non-use of the vehicle, etc.), the simulation computing system may receive the request to evaluate a performance of the updated version of the controller as compared to a performance of an on-vehicle version of the controller.

Responsive to receiving the request to validate the updated controller, the simulation computing system may generate a simulation comprising data associated with a previous operation of the vehicle, such as that controlled by the on-vehicle controller. The data may include sensor data captured by one or more sensors on the vehicle and/or one or more remote sensors (e.g., on another vehicle, mounted in the environment, etc.), map data (e.g., one or more road segments associated with the environment and/or a vehicle path there-through), determined actions by which a controller (e.g., local or remote operator, active autonomous controller, etc.) controlled the vehicle through the environment, times associated with the actions, and the like.

In various examples, the simulation computing system may generate the simulation based on one or more scenarios associated with the previous operation of the vehicle. In such examples, the data may include data associated with the scenario(s). A scenario may include a portion of time associated with the previous operation of the vehicle in which the on-vehicle controller determined one or more actions to take based on sensor data, map data, and the like. The action(s) may include staying in a lane, a lane change, a merge, a speed variation (e.g., maintain velocity, accelerate, decelerate, etc.), a positional variation (e.g., changing a position in a lane), and the like.

In various examples, the scenario may include one or more actions determined by the on-vehicle controller based on an interaction with one or more objects in an environment of vehicle operation and the action(s) associated therewith. The object(s) may include any number and/or type of dynamic and/or static objects, such as cars, pedestrians, trucks, buildings, construction zones, and the like. As a non-limiting example, the interaction with the object may include a detection of the object, a determination of a trajectory associated with the object, and a determination of an action to take to avoid the object, if necessary. For example, a scenario may include the on-vehicle controller detecting an object, identifying the object as a pedestrian, determining to yield to the pedestrian, and causing the vehicle to slow a forward speed based on the yield. The scenario may include the portion of time associated with each of the above-mentioned actions and/or a time buffer (e.g., 0.5 seconds, 1 second, etc.).

In various examples, the simulation computing system may determine the scenario(s) based on a component and/or subcomponent of the updated controller to be evaluated. In some examples, the simulation computing system may identify a set of scenarios associated with the on-vehicle controller maximizing a number of functionalities (e.g., actions to be performed, sub-goals associated with an action, etc.) associated with the component and/or subcomponent. In such examples, the simulation computing system may be configured to maximize the number of functionalities exercised in the simulation. For example, the simulation computing system may be configured to evaluate the performance of the updated controller in a first configuration associated with two-wheel steering and the performance of the updated controller in a second configuration associated with four-wheel steering, such as to ensure the controller performance is substantially the same (e.g., within a threshold) in each configuration. The simulation computing system may determine the set of scenarios based on scenarios that include tight turns, such as to stress the functionality of the steering component in controlling the vehicle around double-parked vehicles, maneuvering to avoid a jaywalker, and the like. For another example, the simulation computing system may be configured to evaluate the performance of a planner component of the updated controller. In such examples, the simulation computing system may identify a set of scenarios that include a maximized number of actions and sub-goals associated with the planner operation.

In some examples, the simulation computing system may maximize the number of functionalities of the controller and/or particular component or subcomponent thereof that are exercised in a simulation by selecting the scenario(s) that include at least a threshold percentage (e.g., 90%, 95%, etc.) of a total number of actions and/or sub-goals associated with the controller and/or the particular component or subcomponent thereof. For example, the simulation computing system may receive a request to test a planner component. The simulation computing system may identify a set of scenarios to test the planner component based on a determination that the set of scenarios includes at least 85% of the actions and/or sub-goals that the planner is configured to perform.

In some examples, the simulation computing system may determine the scenario(s) based on commonly used functionality associated with the controller and/or particular component or subcomponent thereof. In some examples, the simulation computing system may process data associated with a plurality of vehicles to determine the commonly used functionality and may store an indication thereof in a datastore. In some examples, the commonly used functionality may include a number and/or percentage of actions and/or sub-goals exercised most often by the controllers (e.g., top 5 actions, top 15 sub-goals, etc.), actions and/or sub-goals that are utilized more than a threshold amount per average vehicle trip (e.g., from initial location to destination) (e.g., a particular action used on average more than 3 times per vehicle trip), and the like. In various examples, the simulation computing system may receive the request and determine the scenarios based on the commonly used functionality, such as to ensure validation of the updated controller with respect to the most commonly used functions of the controller and/or the particular component or subcomponent thereof.

Additionally or in the alternative, the simulation computing system may determine the scenario(s) based on a user input received via the user interface. In some examples, the user interface may be configured to enable a user (e.g., software developer, operator of the simulation computing system, etc.) to select a set of scenarios for the requested evaluation of the updated controller. In some examples, the set of scenarios may include one or more pre-determined sets of scenarios. In some examples, the set of scenarios may be determined based on particular object interactions, location of vehicle travel (e.g., urban, highway, etc.), identification of behavioral or non-behavioral decision making, or the like. For example, a user may update a code associated with a non-behavioral change to the controller (e.g., the code modification should not modify an action taken by the vehicle). The user may input a selection of a set of scenarios associated with an evaluation of the controller to ensure that the code modification does not change an action taken by the vehicle as determined by the updated controller.

In various examples, the simulation computing system may receive a set of scenarios identified by the user for the evaluation of the updated controller. In some examples, the user interface may be configured to receive an input corresponding to the set of scenarios and/or a location (e.g., uniform resource locator (URL), etc.) associated with a storage of the set of scenarios. In such examples, the simulation computing system may determine the scenario(s) based on the user input.

Based at least in part on the determined scenario(s), the simulation computing system may generate the simulation for evaluating the updated controller. In various examples, the computing system may generate simulations utilizing techniques such as those described in U.S. patent application Ser. No. 16/376,842, filed Apr. 5, 2019 and entitled "Simulating Autonomous Driving Using Map Data and Driving Data," and U.S. patent application Ser. No. 16/555,988, filed Aug. 29, 2019 and entitled "Vehicle Controller Simulations," the entire contents of which are incorporated herein by reference.

The simulation computing system may run the simulation and may cause the updated controller to control a simulated vehicle associated therewith. In various examples, the simulation computing system may determine a plurality of metrics corresponding to a plurality of attributes associated with a control of the simulated vehicle in the simulation. The simulation computing system may compare the metrics associated with the control of the simulated vehicle by the updated controller to corresponding metrics associated with the control of the vehicle by the control version of the controller.

In various examples, the simulation computing system may determine a difference between a first set of metrics associated with the control of the simulated vehicle by the updated controller and a second set of metrics associated with control of the vehicle by the control version. In some examples, the simulation computing system may determine a difference between corresponding metrics of the first set of metrics and the second set of metrics. In such examples, the simulation computing system may compare values of each metric between the first set of metrics and the second set of metrics.

In various examples, the simulation computing system may determine whether differences between the corresponding metrics between the first set of metrics and the second set of metrics are less than a threshold value. In various examples, the threshold value may be determined based on the attribute associated with the metric. For example, a simulation computing system may determine that a maximum difference in a steering angle is less than a threshold value associated with the maximum difference in the steering angle. In some examples, the threshold values may be associated with a determination of whether a behavioral change is expected. For example, based on a determination that an update to a controller is not intended to cause a behavioral change to a way in which the controller controls the vehicle, the threshold may include a first threshold. Based on a determination that the update to the controller is intended to cause a behavioral change, the threshold may include a second threshold that is different from the first threshold.

In some examples, the threshold value may be determined based on a component and/or subcomponent corresponding to the attribute associated with the metric. For example, a planner component and a tracker component of a controller may include a same or substantially similar attribute, such as a determination of a maximum velocity. The planner component may have associated therewith a first threshold value corresponding to the maximum difference in determined velocities by the planner component between the updated version of the controller and the control version of the controller and the tracker component may have associated therewith a second threshold value corresponding to the maximum difference in determined velocities by the tracker component.

Based on a determination that the differences between the corresponding metrics are equal to or less than the threshold differences, the simulation computing system may validate the updated controller. In some examples, responsive to a validation, the simulation computing system may transmit the updated controller to a vehicle computing system associated with a vehicle, such as to control the vehicle operating in the environment.

Based on a determination that the differences between the corresponding metrics are equal to or greater than the threshold differences, the simulation computing system may cause an indication of invalidity to be presented via the user interface. In some examples, the indication of invalidity may include a particular component and/or subcomponent with a resulting metric that exceeded a threshold value. In some examples, the indication of invalidity may include a particular action or sub-goal associated with a component with a resulting metric that exceeded the threshold value.

In various examples, the simulation computing system may cause the results associated with each component to be presented to the user, such as to review any or all of the calculated differences between the metrics. In various examples, the results may include a number of times that a component of each controller performed particular actions and/or sub-goals during the simulation. In such examples, the simulation computing system may enable the user to identify particular improvements to the functioning of the updated controller. For example, an updated controller may have associated therewith a decreased number of yielding instances when the vehicle has a right of way as compared to the control version. For another example, the updated controller may have associated therewith an increased number of merging interactions as compared to the control version, illustrating a more natural, human-like functioning of the updated controller.

The techniques discussed herein may improve the functioning of an autonomous vehicle in many ways. For example, the techniques discussed herein may provide simulations for testing a performance of an updated version of autonomous controller, to ensure the updated version of the autonomous controller may safely operate in a dynamic environment. For another example, the techniques described herein may readily validate the operation of an autonomous controller, such as after a software upgrade has been implemented. Additionally, the techniques described herein may provide a means by which a computing system and/or user may identify unintended changes to a performance of the autonomous controller based on the software upgrade. As such, the techniques described herein may greatly improve safety of autonomous vehicle operations.

Furthermore, the techniques described herein provide a means by which a user may evaluate a performance of a particular component of an autonomous controller. Additionally, the user may limit a number and/or percentage of scenarios tested in the evaluation. By limiting an evaluation to the particular component and/or to a number and/or percentage of scenarios to be tested, the techniques described herein reduce an amount of processing power and/or memory required to run a particular simulation. Accordingly, the techniques described herein improve the functioning of the simulation computing device.

The techniques described herein may be implemented in a number of ways. Example implementations are provided below with reference to the following figures. Although discussed in the context of an autonomous vehicle, the methods, apparatuses, and systems described herein may be applied to a variety of systems (e.g., a sensor system or a robotic platform), and are not limited to autonomous vehicles. In one example, similar techniques may be utilized in driver-controlled vehicles in which such a system may provide an indication of whether it is safe to perform various maneuvers. In another example, the techniques may be utilized in an aviation or nautical context, or in any system using planning techniques.

FIG. 1 illustrates an example process 100 for validating an updated autonomous controller 102 (e.g., first autonomous controller 102), in accordance with examples of this disclosure. In various examples, the autonomous controller 102 may include an update to a controller associated with a vehicle 104. The vehicle 104 may include an autonomous or semi-autonomous vehicle configured to be controlled by an autonomous controller. In various examples, responsive to validating the first autonomous controller 102, the simulation computing system may cause the first autonomous controller 102 (e.g., updated autonomous controller) to be transmitted to the vehicle 104, such as to be incorporated as an on-vehicle controller.

The autonomous controller 102 may include a one or more components configured to assist in controlling the vehicle along a path, determine an action for the vehicle 104 to take, such as in response to the events (e.g., traffic light turns red, vehicle approaches stop sign, etc.) and/or objects (e.g., static and dynamic objects) in an environment. As non-limiting examples, the autonomous controller 102 may include a perception component, a prediction component, a planner component, and a tracker component. The perception component may be configured to perform object detection, segmentation, and/or classification. The prediction component may be configured to determine one or more object trajectories associated with predicted paths of detected objects. The planner component may be configured to determine a location of the vehicle 104 and determine one or more vehicle trajectories associated with traveling from the location along a route to a destination. The planner component may additionally be configured to determine actions for the vehicle to take based on detected objects and/or potential interactions between the vehicle 104 and the detected objects. The tracker component may be configured to determine a position and/or orientation of the vehicle, such as based on steering angles, velocities, accelerations, drive direction, drive gear, and/or gravity acceleration.

In various examples, the autonomous controller 102 may control the vehicle 104 utilizing sensor data captured by one or more sensors on the vehicle 104 and/or one or more remote sensors (e.g., on another vehicle, mounted in the environment, etc.). The sensor(s) may include cameras, motion detectors, lidar, radar, and the like. In various examples, the autonomous controller 102 may control the vehicle 104 based on object data associated with one or more detected objects in the environment. The object data may include an object location, an object type or classification (e.g., car, truck, pedestrian, bicyclist, etc.), and/or a predicted object trajectory of the object. For example, the autonomous controller 102 may be configured to detect a double-parked vehicle (DPV) located in a planned path of the vehicle. The autonomous controller 102 may be configured to determine a viable route (e.g., route clear of other obstacles) around the DPV. Responsive to determining the viable route, the autonomous controller 102 may control the vehicle along the viable route around the DPV, such as by utilizing one or more drive systems.

Due in part to the complexity of the autonomous controller 102 and the components and subcomponents associated therewith, the autonomous controller 102 may be periodically updated. In some examples, the autonomous controller 102 may be updated to optimize a performance thereof. For example, a software developer may refactor a portion of code associated with the autonomous controller 102, such as to reduce latency associated with the portion of code. In various examples, a simulated computing system may be configured to evaluate a performance of the updated autonomous controller (e.g., with the refactored code) prior to sending the updated autonomous controller to the vehicle, such as ensure the update does not result in unintended consequences with regard to autonomous controller behavior (e.g., the updated autonomous controller controls the vehicle as expected).

At operation 106, a simulation computing system may receive a request to validate a first autonomous controller 102. The first autonomous controller 102 may include an updated autonomous controller. In at least one example, the first autonomous controller 102 may include an update (e.g., software update, modification, etc.) to a second autonomous controller (e.g., previous version, control version of the controller). In various examples, the second autonomous controller (not illustrated in FIG. 1) may represent an on-vehicle controller, such as a controller configured to control a vehicle in operation in an environment. Though illustrated as a request to validate the first autonomous controller 102, this is not intended to be so limiting, and the request may additionally or alternatively include a request to validate a particular component and/or subcomponent of the first autonomous controller 102. For example, a software developer may refactor a code associated with a planner component. The software developer may thus submit a request to validate the planner component of the first autonomous controller, such as to verify that the planner functions as expected.

In some examples, the simulation computing system may receive the request to validate the first autonomous controller 102 (e.g., an updated version of the controller) based on a validation schedule. In such examples, the simulation computing system may receive the request based on the validation schedule, such as a stored instruction to periodically (e.g., twice a day, daily, weekly, etc.) validate the first autonomous controller 102. In various examples, the simulation computing system may validate the first autonomous controller 102 based on data associated with a second autonomous controller that is currently associated with the vehicle 104 (e.g., on-vehicle controller). For example, one or more developers may update different portions of code of the first autonomous controller 102 throughout a twelve-hour period. The simulation computing system may receive a request to validate the first autonomous controller 102 based on the updates, based on a validation schedule of twice daily.

In various examples, the simulation computing system may receive the request to validate the updated version of the controller via an interface, such as user interface 112 illustrated in FIG. 1. The user interface 112 may be associated with the simulation computing system and/or another computing device, such as a user computing device associated with a user. In some examples, the user interface 112 may be accessible via an application (e.g., web-based application, native application, etc.) through which the simulation computing system may receive the request.

As illustrated in FIG. 1, the user interface 112 may include a candidate entry input box 116 and a control entry input box 118. The candidate entry input box 116 and the control entry input box 118 may be configured to receive a first identifier 108 associated with the first autonomous controller 102 and a second identifier 110 associated with a second autonomous controller, respectively. In various examples, the first identifier 108 and the second identifier 110 may include unique identifiers associated with the respective versions of the controller (or a component thereof) to be validated (e.g., first autonomous controller 102) or utilized as a control (e.g., a second autonomous controller, previous version of controller, on-vehicle controller, etc.) in the validation. In various examples, the first identifier 108 and the second identifier 110 may include secure hash functions, uniform resource locators, and/or other identifiers that are unique to and/or may be used to identify the respective versions of the controller.

In various examples, the user interface 112 may include a contact input box 120. In various examples, the contact input box 120 may provide a means by which the user may provide contact information, such as an electronic mail (e-mail address), a communication system identifier (e.g., a handle), or other means for presenting a validation report associated with the validation of the first autonomous controller 102. In some examples, and as will be discussed below with respect to FIGS. 3-9, the user may access data associated with the validation report via the user interface 112.

At operation 122, responsive to the request, the simulation computing system generates a simulation 124 based on data associated with an operation of a vehicle controlled by the second autonomous controller. The data may include sensor data captured by one or more sensors on the vehicle and/or one or more remote sensors (e.g., on another vehicle, mounted in the environment, etc.), map data (e.g., one or more road segments associated with the environment and/or a vehicle path there-through), determined actions by which a controller (e.g., local or remote operator, active autonomous controller, etc.) controlled the vehicle through the environment, times associated with the actions, and the like. As discussed above, in various examples, the second autonomous controller may include a version of a controller or component (or subcomponent) thereof that is incorporated on-vehicle, such as that the second autonomous controller is configured to control operations of the vehicle from an initial location to a destination. In various examples, the second autonomous controller may include a version of the controller that is not incorporated on-vehicle but is used as a control version of the controller for validation.

In various examples, the simulation computing system generates the simulation 124 based on a version of one or more hardware components associated with a vehicle computing system on which the second autonomous controller (e.g., control version of the controller) operates. In at least one example, the simulation computing system determines a version of a graphics processing unit (GPU) associated with the vehicle computing system. In various examples, the simulation computing system identifies one or more simulation computing devices configured with a same version of the one or more hardware components associated with the vehicle computing system and generates the simulation in association with the one or more identified simulation computing devices. In such examples, the simulation computing system may minimize error introduced due to differences in hardware components of the computing systems. At least because the simulation computing system minimizes errors introduced by disparate hardware components and can ensure consistent environment (e.g., visibility, initial positions of objects, etc.), the simulation computing system may decrease a total number of simulations and/or scenarios tested to ensure an accuracy of the validation, reducing the processing power and/or memory required to validate a controller. Accordingly, by utilizing the techniques described herein, the functioning of the simulation computing system may be improved.

In various examples, the simulation computing system may generate the simulation based at least in part on one or more scenarios associated with the previous operation of the vehicle 104. In such examples, the data may include data associated with the scenario(s). A scenario may include a portion of time associated with the previous operation of the vehicle in which the on-vehicle controller determined one or more actions to take based on sensor data, map data, and the like. The action(s) may include staying in a lane, a lane change, a merge, a speed variation (e.g., maintain velocity, accelerate, decelerate, etc.), a positional variation (e.g., changing a position in a lane), and the like. For example, a scenario may include identifying an object 126 operating proximate the vehicle and determining that a predicted trajectory 128 of the object 126 (e.g., determined based on an acceleration and/or a signal 130 indicating an intent to change lanes) includes a lane change in front of the vehicle 104. The scenario may test a performance of the first autonomous controller 102 to detect the object 126, determine the predicted trajectory 128, determine a stay in lane action associated with a path 132 of the vehicle and decelerate to increase a buffer between the merging object 126 and the vehicle 104.

In various examples, the simulation computing system may determine a plurality of scenarios to exercise (e.g., for evaluating a performance of) a plurality of actions and sub-goals of one or more components of the autonomous controller 102. In various examples, the scenarios may be selected to exercise a threshold number or percentage of actions and/or sub-goals of the component(s) (e.g., 90%, 93%, etc.). In some examples, the request may include a request to validate a particular component of the autonomous controller 102. In such examples, the scenarios may be selected (e.g., simulation generated) based on scenarios associated with actions and/or sub-goals associated with the particular component and/or subcomponent. For example, a test to a planner component may include scenarios associated with preparing to park, parking, changing lanes, merging, a forced merge interaction, and various other actions and/or sub-goals associated with the planner component.

In various examples, the simulation computing system may determine the scenarios based on user input, such as via the user interface 112. For example, the user may input particular scenarios to be used and or a URL associated with a set of scenarios to use in the simulation 124. In some examples, the input may include a limitation associated with the scenarios, such as a type of scenarios used, a total number or percentage of scenarios to be used, or the like. For example, a user may update the first autonomous controller 102 to improve interactions of the vehicle 104 with pedestrians, such as to increase a safety buffer associated therewith to improve safe operations of the vehicle 104. The user may input a limitation of the scenarios to those including interactions with humans, such as to expedite the evaluation process. By limiting the amount of data processed in the simulation, the simulation computing system may reduce a total amount of processing power and/or memory required to validate the first autonomous controller 102, thereby improving the functioning of a simulation computing system. For another example, the user interface 112 may include an option to limit a percentage or number of scenarios run in the simulation, such as to expedite the evaluation process.

At operation 134, the simulation computing system runs the simulation 124 with the first autonomous controller 102 controlling a simulated vehicle 136. Though illustrated as including the vehicle 104 and the simulated vehicle 136, this is merely for illustrative purposes and the simulation may not include the vehicle 104, but instead, a simulation thereof. In various examples, the simulation computing system may cause the first autonomous controller 102 to control the simulated vehicle 136 through the scenario(s) associated with the simulation, such as to evaluate one or more components thereof. The simulation computing system may determine metrics associated with one a plurality of performance attributes of the first autonomous controller 102, such as metrics associated with a number of determined points of a corridor corresponding to the vehicle path, velocities, accelerations, a number of determined actions, and the like. In various examples, the simulation computing system may determine metrics associated with one or more of the plurality of performance attributes at pre-determined time intervals (e.g., every 0.1 second, 0.2 seconds, etc.). In such examples, the simulation computing system may determine the metrics associated with the performance attribute(s) of the autonomous controller 102 controlling the simulated vehicle 136 at each time interval. For example, the simulation computing system may determine a velocity of the simulated vehicle 136 every 0.1 second throughout the simulation.

In some examples, the simulation computing system may determine metrics associated with a second plurality of performance attributes of the second autonomous controller (e.g., associated with a previous operation of the vehicle 104). In various examples, the simulation computing system may receive the metrics from a vehicle computing system, such as with the data received above, in a periodic upload of data, or the like. In some examples, the simulation computing system may receive the metrics from the vehicle computing system in real-time or near-real time during the operation of the vehicle as controlled by the second autonomous controller. In such examples, the simulation computing system may store the metrics associated with the performance attributes of the second autonomous controller. In various examples, the simulation computing system may store the metrics associated with the second autonomous controller controlling the vehicle 104 (e.g., actions determined, time to determine an action, number of actions considered, velocities, accelerations, etc.) in a datastore associated with the simulation computing system.

In some examples, the simulation computing system may receive the data comprising sensor data, map data, actions determined, and the like, and may be configured to determine the performance metrics associated with the second autonomous controller. In such examples, the simulation computing system may be configured to calculate one or more of the metrics associated with a plurality of performance attributes of the second autonomous controller based on the data. In some examples, the simulation computing system may generate a second simulation (e.g., a second instantiation of the simulation 124). In such examples, the simulation computing system may run the second instantiation of the simulation 124 with the second autonomous controller controlling a second simulated vehicle 136 based on the data. The simulation computing system may determine the metrics associated with performance attributes of the second autonomous controller based on the performance of the second autonomous controller in the second instantiation of the simulation 124.

At operation 138, the simulation computing system determines a difference 140 between a first value of a metric associated with a performance attribute 142 (e.g., maximum velocity difference) corresponding to the first autonomous controller 102 and a second value of the metric corresponding to the second autonomous controller. In various examples, the difference 140 may include a maximum difference associated with the metric in a respective scenario 144. In such examples, the difference 140 may represent a maximum deviation in performance between the two versions of the autonomous controller (e.g., candidate versus control, first autonomous controller 102 versus second autonomous controller) in the scenario. For example, the maximum velocity difference between the controllers in the first scenario is 0.24 meters per second (m/s). In some examples, the difference 140 may include a maximum difference associated with a particular time interval. For example, the difference 140 between a first value and a second value of the metric may include a time interval at which a greatest difference between the first value and the second value exists.

In various examples, a summary of differences 140 may be presented via the user interface 112, such as in a validation metrics 146 (e.g., report, results, etc.). In the illustrative example, the validation metrics 146 includes a list of scenarios and differences 140 associated with a particular performance attribute 142. However, the illustration of a single performance attribute 142 is not intended to be so limiting and the validation metrics 146 may include differences 140 associated with the plurality of performance attributes 142 evaluated in the simulation 124.

At operation 148, the simulation computing system determines whether the difference 140 is equal to or less than a threshold value. In various examples, the threshold difference may be determined based on the performance attribute 142. In some examples, the threshold value may be determined based on a component and/or subcomponent corresponding to the performance attribute 142 associated with the metric. For example, a planner component and a tracker component of a controller may include a same or substantially similar performance attribute 142, such as a determination of a maximum velocity. The planner component may have associated therewith a first threshold value corresponding to the maximum difference in determined velocities by the planner component between the first autonomous controller 102 and the second autonomous controller and the tracker component may have associated therewith a second threshold value corresponding to the maximum difference in determined velocities by the tracker component.

Based on a determination that the difference is equal to or less than the threshold value ("Yes" at operation 148), the simulation computing system may, at operation 150, validate the first autonomous controller 102. In various examples, responsive to validating the first autonomous controller 102, the simulation computing system may cause an indication of validation 152 to be presented via the user interface 112. In the illustrative example, the indication of validation 152 includes the words "FIRST AUTONOMOUS CONTROLLER VALIDATED." However, this is not intended to be so limiting and the indication of validation 152 may include testing results, metrics, detected improvements in performance of the first autonomous controller 102 as compared to the second autonomous controller, and/or other information about the simulation 124, results, or the like.

In some examples, based on the validation, the simulation computing system may cause the first autonomous controller 102 to be transmitted to one or more vehicles, such as an update to the controllers thereof. In such examples, the validated first autonomous controller 102 may be configured to control a respective vehicle associated therewith. In various examples, the validation performed by the simulation computing system may reduce or eliminate physical tests of the first autonomous controller onboard the vehicle 104. In such examples, the techniques described herein may reduce a number of tests run by the vehicle computing system. As such, the techniques described herein may improve the functioning of the vehicle computing system.

Based on a determination that the difference is greater than the threshold value ("No" at operation 148), the simulation computing system may, at operation 154, output an indication of invalidity 156 of the first autonomous controller 102. In various examples, responsive to determining that the first autonomous controller 102 is invalid, the simulation computing system may cause the indication of invalidity 156 to be presented via the user interface 112. In the illustrative example, the indication of invalidity 156 includes the words "FIRST AUTONOMOUS CONTROLLER INVALID." Additionally, the indication of invalidity 156 includes an indication 158 that particular differences 140 exceed the threshold difference. In the illustrative example, the indication 158 includes a highlight of the particular differences 140, as well as the associated performance attribute 142 and scenario 144.

In various examples, the indication of invalidity 156 may provide an indication of a component and/or subcomponent of the first autonomous controller 102 that failed the evaluation (e.g., difference above the threshold). In such examples, the indication of invalidity may provide a user (e.g., software developer) with the component and/or subcomponent that requires further updating prior to incorporation into the vehicle 104.

FIGS. 2A and 2B are example interfaces associated with submitting a request to validate a performance of an autonomous controller, in accordance with examples of this disclosure. FIG. 2A illustrates a first interface 200A in which a user 202 (illustrated as a cursor) may submit the request. The first interface 200A may be presented to the user 202 via a display associated with a computing device 204. The computing device 204 may include a device associated with the simulation computing system and/or a user computing device, such as that associated with the user 202 (e.g., a developer, operator of the simulation computing system, etc.).

In some examples, the computing device 204 may include desktop computers, laptop computers, tablet computers, mobile devices (e.g., smart phones or other cellular or mobile phones, mobile gaming devices, portable media devices, etc.), or other suitable computing devices. The computing device 204 may execute one or more client applications, such as a web browser (e.g., Microsoft Windows Internet Explorer, Mozilla Firefox, Apple Safari, Google Chrome, Opera, etc.) or a native or special-purpose client application (e.g., social media applications, messaging applications, email applications, games, etc.), to submit requests for validation and/or view the results. In various examples, the computing device 204 may include a single computing device. In some examples, the computing device 204 may include one or more servers or other computing devices, any or all of which may include one or more processors and memory storing computer executable instructions to implement the functionality described herein.

In various examples, the user 202 may submit the request via a request submission page 206. The request submission page 206 may include a candidate entry input box 208, such as candidate entry input box 116 and a control entry input box 210, such as control entry input box 118. In various examples, the candidate entry input box and the control entry input box 210 may be configured to receive user inputs of a first identifier corresponding to an updated controller (e.g., candidate controller) to be tested and a second identifier corresponding to a control version of the controller. The first identifier and the second identifier may include unique identifiers associated with the respective versions of the controller (or a component thereof) to be validated or utilized as a control in the validation. In some examples, the unique identifiers may include a location in a datastore associated with the respective controller. In various examples, the first identifier and the second identifier may include secure hash functions, uniform resource locators, and/or other identifiers that are unique to and/or may be used to identify the respective versions of the controller.

In various examples, the request submission page 206 may include a candidate label entry input box 212 and a control label entry input box 214 via which the user may provide labels for the respective versions of the controller. In various examples, the labels may be utilized in a presentation of the metrics determined during the evaluation and/or derived from data associated with a previous operation of the vehicle (actual or simulated) by the control version of the controller. For example, the simulation computing system may be configured to generate one or more charts corresponding to metrics associated with the respective controllers. The simulation computing system may label the charts based on a candidate label and control label submitted via the candidate label entry input box 212 and a control label entry input box 214.

In various examples, the request submission page 206 may include a contact info input box 216, such as contact input box 120. In various examples, the contact info input box 216 may provide a means by which the user may provide contact information, such as an electronic mail (e-mail address), a communication system identifier (e.g., a handle), or other means for presenting a validation report associated with the validation of the candidate controller. In some examples, and as will be discussed below with respect to FIGS. 3-9, the user may access data associated with the validation report via the interface 200A.

In various examples, the request submission page 206 may include a configuration evaluation selectable option 218 for the user 202 to limit the evaluation of the controller and/or a component (or subcomponent) thereof to a configuration comparison. In various examples, responsive to receiving an indication of selection of the configuration evaluation selectable option 218, the simulation computing system may evaluate the performance of the candidate controller in the two-wheel steering configuration and the four-wheel steering configuration. In such an example, the simulation computing system may compare the performance of the candidate controller in each configuration, such as to determine whether the candidate controller operates within a threshold difference between the two configurations.

In various examples, the request submission page 206 may include a submission selectable option 220 via which the user 202 may submit the request. Though illustrated as including the label "LAUNCH," this is not intended to be so limiting, and any other label may be associated with submission selectable option 220, such as "SUBMIT," "SEND," or "GO," to name a few.

In various examples, absent additional input, the simulation computing system may be configured to determine scenarios to be run to test the candidate controller. In various examples, the scenarios may include a pre-determined set of scenarios associated with previous operation of the control version controlling the vehicle in an environment. In some examples, a pre-determined set of scenarios may be determined to test the entire candidate controller, such as from perception to tracking. In at least one example, the pre-determined set of scenarios may include between 645 and 700 scenarios. In some examples, the pre-determined set of scenarios may include scenarios associated with testing one or more components of the candidate controller and/or a performance of the candidate controller controlling the vehicle in different configurations. In such examples, the pre-determined set of scenarios may include a reduced number of scenarios. In at least one example, the performance of the candidate controller in controlling the vehicle in different configurations may be limited to between 5 and 20 scenarios. In at least one example, a pre-determined set of scenarios for testing the candidate controller with respect to different configurations includes 10 scenarios.

In various examples, the request submission page may include additional options for the user 202 to select and/or limit datasets. In various examples, responsive to receiving an indication that the user 202 selects an additional options selectable icon 222, the simulation computing system may cause one or more additional options for customizing and/or tailoring the validation based on user inputs, such as that illustrated in the second interface 200B of FIG. 2B.

In various examples, the request submission page 206 may include a path to dataset input box 224 and/or a URL input box 226 configured to receive a user input with respect to a set of scenarios to be used in testing. In various examples, the user 202 may submit a particular path to the set of scenarios via the path to dataset input box 224. In such examples, the path may provide the simulation computing device with location associated with the simulation computing device at which the simulation computing device may access the dataset. In various examples, the URL input box 226 may provide a uniform resource locator associated with the dataset stored in a datastore. For example, the user 202 may input a set of scenarios via the path to dataset input box 224 and/or the URL input box 226 and may cause the simulation computing system to evaluate the candidate controller utilizing the scenarios input. In such examples, the simulation may be generated based on the user input with respect to the scenarios.

In various examples, the request submission page 206 may include an evaluation limitation input box 228. In some examples, the user 202 may submit a number of scenarios to be associated with the simulation. In some examples, responsive to receiving a limitation of the number of scenarios, the simulation computing system may identify the number of scenarios that exercise a maximum number of actions and/or sub-goals associated with the controller and/or component thereof to be evaluated.

In various examples, the evaluation limitation input box 228 may be configured to receive a limitation of an amount of time for running the evaluation. In some examples, the user 202 may perform an initial update to a component and may test the performance thereof prior to further updating the component, such as to determine with reasonable probability, the efficacy of the initial update prior to further building on it. However, the user 202 may not have the time necessary to run a full evaluation of the controller. The user 202 may thus limit the amount of time associated with the evaluation, to perform an initial test on the initial update.

In various examples, limiting the amount of time associated with the evaluation may limit a total number of scenarios run in the simulation. For example, limiting the evaluation to 15 minutes may result in about 30% of the scenarios run (e.g., 30% of a pre-defined set of scenarios, 30% of a set of scenarios input via the path to dataset input box 224 and/or the URL input box 226, etc.). Though this is merely an example and is not intended to be so limiting, the computing system may select the scenarios that are run in a limited evaluation based on time associated therewith (e.g., the scenarios in consecutive order), a number of actions and/or sub-goals associated with each of the scenarios (e.g., scenarios with a highest amount of actions and/or sub-goals exercised, scenarios with a variety of different actions and/or sub-goals, etc.)).

In various examples, the request submission page 206 may include a dataset limitation input box 230 including a menu selectable option 232. Responsive to receiving an indication of selection of the menu selectable option 232, the simulation computing system may cause a dataset limitation window 234 to be presented via the request submission page 206. The dataset limitation window 234 may include a list of one or more pre-defined datasets limited based on a type of scenario associated with each of the pre-defined datasets. In the illustrative example, the list includes a first pre-defined dataset including human interactions, a second pre-defined dataset including action references, a third pre-defined dataset including highway scenarios, and a fourth pre-defined dataset including non-behavioral scenarios (e.g., scenarios associated with not modifying a trajectory of the vehicle, etc.). though this is not intended to be so limiting and the list may include additional or alternative pre-defined datasets, such as those associated urban environments, suburban environments, construction zone environments, or the like.

As discussed above, the user 202 may submit the request by selecting the submission selectable option 220. Responsive to receiving an indication of selection of the submission selectable option 220, the simulation computing system may process the data associated with the request, such as that input via the request submission page 206. In various examples, the simulation computing system may receive the request responsive to the user 202 selecting the submission selectable option 220.

Figure 3:
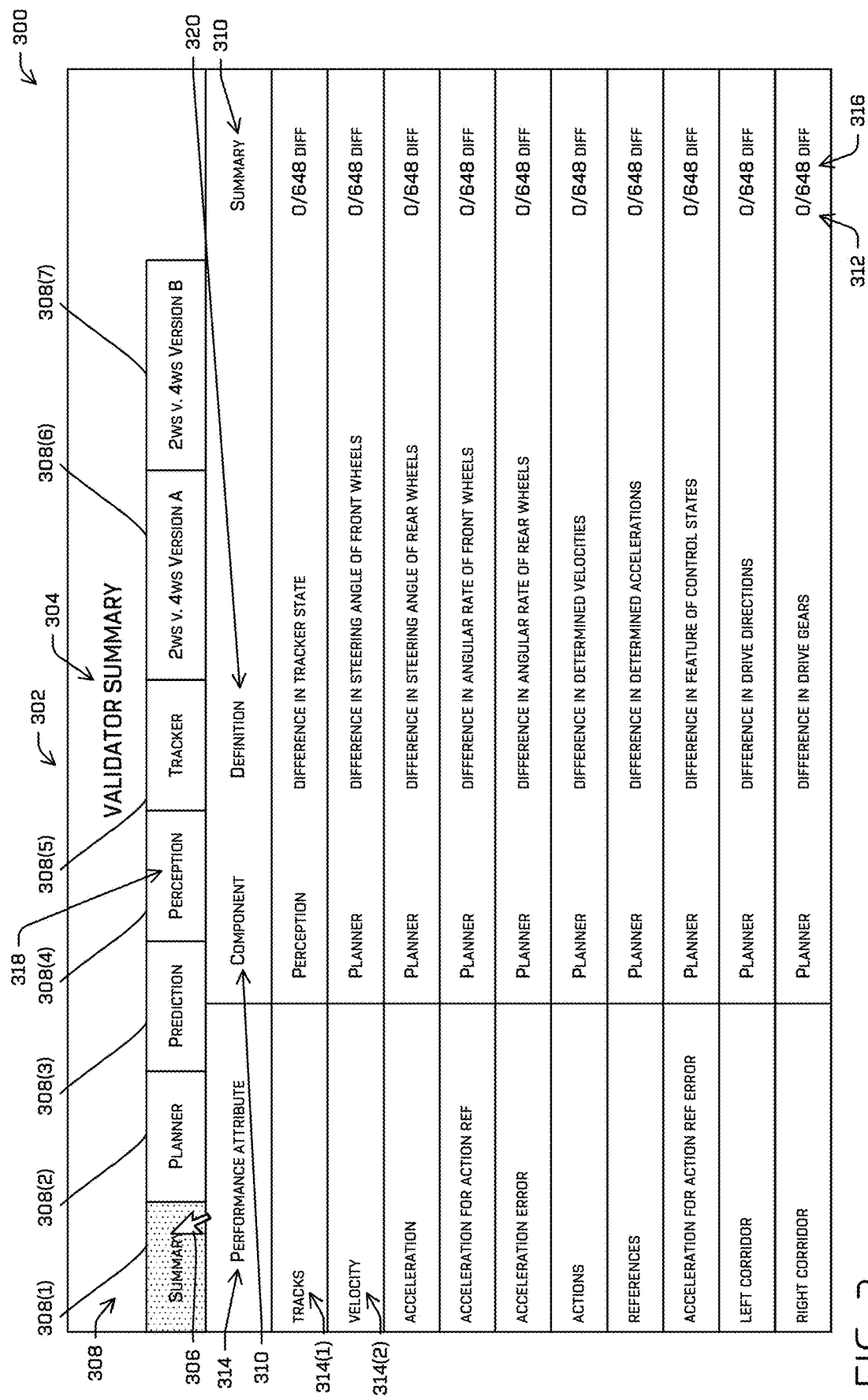
FIG. 3 is an example interface in which a summary of results of a performance evaluation associated with an autonomous controller may be displayed, in accordance with examples of this disclosure.

FIG. 3 is an example interface 300 illustrating a summary page 302 in which a summary of validation results 304 of a performance evaluation associated with a controller, such as autonomous controller 102, may be presented. In some examples, the simulation computing system may cause the summary page 302 to be presented to a user 306 at a completion of a controller evaluation, such as that initiated based on a request from the user 306 and/or periodically.

Figure 2:
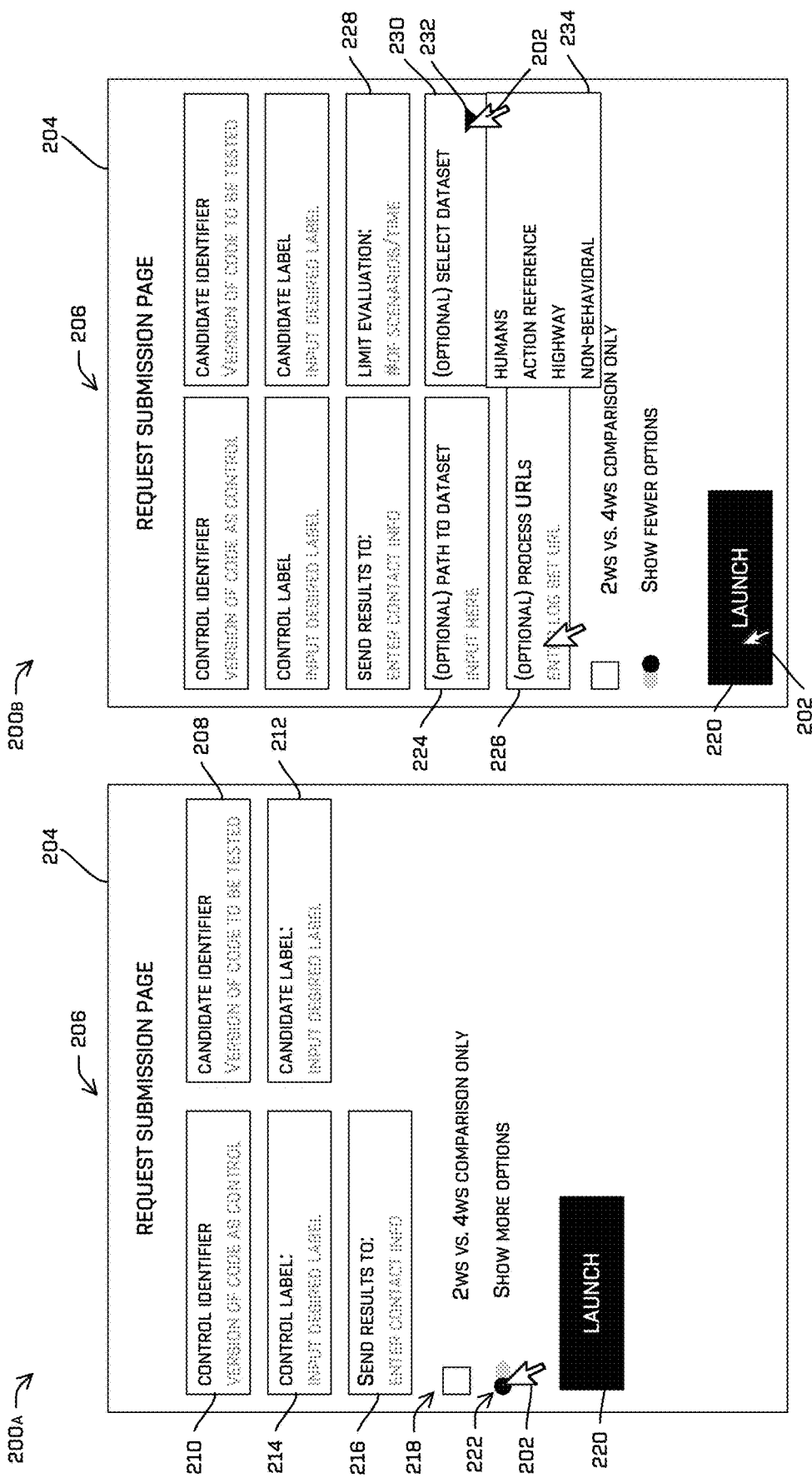
FIGS. 2A and 2B are example interfaces associated with submitting a request to validate a performance of an autonomous controller, in accordance with examples of this disclosure.

In various examples, the summary page 302 may be associated with a user interface, such as user interface 112 of FIG. 1 and user interfaces 200A and 200B of FIG. 2. In some examples, the simulation computing system may cause the summary page 302 to be presented via an application associated with the simulation computing system, such as a web-based application, a native or special purpose application, or the like. In various examples, the summary page 302 may be presented to a user 306 as a stand-alone document (e.g., not application or web-based). In such examples, the simulation computing system may transmit the document including the summary page 302 to the user 306 at the completion of the controller evaluation based on a user input via a contact input box, such as contact input box 120. For example, the user may input an email address into the contact input box. Based on a determination that the controller evaluation is complete and/or that the simulation computing system has determined the validation results, the simulation computing system may transmit the validation results to the email address associated with the user 306.

In various examples, the summary page 302 may include one or more tabs 308 associated with various components of the controller. In some examples, the tabs 308 may represent one or more components and/or configurations evaluated in the controller evaluation. In the illustrative example, the tabs 308 include a summary tab 308(1), a planner component tab 308(2), a prediction component tab 308(3), a perception component tab 308(4), a tracker component tab 308(5), a first configuration tab 308(6) (e.g., evaluation of control of a first version of the controller (controller A) in two-wheel steering configuration versus a four-wheel steering configuration), and a second configuration tab 308(7) (e.g., evaluation of control of a second version of the controller (controller B) in the different configurations). Though this is merely an example, and the validation results 304 may include additional or alternative tabs 308 associated with the controller evaluation.

The tabs 308 may include selectable options, enabling the user 306 to switch between validation result pages associated with each component and/or configuration. For example, responsive to a selection of the summary tab 308(1), the summary page 302 may be presented via the user interface and/or in the document. As illustrated, the summary page 302 may include a summary 310 of data results associated with the performance evaluation. The summary 310 may include a number of scenarios 312 in which the candidate controller performed differently from the control version of the controller with respect to a particular performance attribute 314. In various examples, the summary 310 may illustrate a ratio of the number of scenarios 312 in which the controllers performed differently with respect to the particular attribute 314 to a total number of scenarios 316 in which the particular attribute 314 of the controller was evaluated. The total number of scenarios 316 may include the number of scenarios included in the set of scenarios (dataset) in which the candidate controller was evaluated. As discussed above, the total number of scenarios 316 may be determined by the simulation computing device or may be determined based on user input, such as user input received via a request submission page (request submission page 206 of FIG. 2).

In various examples, the summary page 302 may include performance attribute data associated with the different performance attributes 314 evaluated. The performance attribute data may include a component 318 associated therewith. For example, a first performance attribute 314(1) (illustrated as tracks) may be associated with a perception component (e.g., associated with a number of objected detected in various portions of the environment and/or with respect to a ground truth number of objects), whereas a second performance attribute 314(2) (illustrated as velocity) may be associated with a planner component. In various examples, the performance attribute data may additionally include a definition 320 describing the respective performance attribute 314. For example, the first performance attribute 314(1) may be described as a "fraction of tracks which are new" and the second performance attribute 314(2) may be described as a "maximum absolute deviation in longitudinal velocity," though the illustrated performance attributes 314 and the definitions 320 associated therewith are not intended to be so limiting and additional or alternative performance attributes 314 and/or definitions may be presented via the summary page 302. For example, the user 306 may scroll up or down on the page to view additional performance attributes 314 and the performance attribute data and summary 310 associated therewith.

In the illustrative example, the candidate controller evaluated in the validation simulation performs substantially similarly to the control version of the controller (e.g., number of scenarios 312 in which the controllers performed differently is zero for each performance attribute). In such an example, the simulation computing system may determine that any determined differences in metrics between the performance of the candidate controller and the control version are within a threshold difference, such as to result in a determination of substantial similarity. In various examples, based on a determination that the candidate controller performs substantially similarly to the control version (e.g., evaluated metrics are within the threshold), the simulation computing system may validate the candidate controller.

FIG. 4 is an example interface 400 illustrating a summary page 402, such as summary page 302, in which the a summary of validation results 404 of a performance evaluation associated with a controller, such as autonomous controller 102, illustrates that a candidate version of the controller performs differently from the control version of the controller. As described above, the simulation computing system may run a simulation in which the candidate controller controls a simulated vehicle based on data associated with the control version of the controller. The simulation computing system may compare metrics associated with a performance of the controller with respect to the performance attributes 406, such as performance attributes 314.

Based on a determination that a difference in the metrics associated with each performance attribute 406 in each scenario is within a threshold difference, the simulation computing system may determine that the candidate controller performs substantially similarly to the control version of the controller with respect to the particular performance attribute 406. The simulation computing device may determine that the number of scenarios in which the controllers performed differently with respect to the particular performance attribute 406, such as the number of scenarios 312, is zero. For example, the simulation computing system may determine that the differences between the metrics associated a first performance attribute 406(1) may be within the threshold difference. As such, the simulation computing system may cause a first summary 410(1) associated with the first attribute 406(1) to be presented via the summary page. The first summary 410(1) may provide an indication that any detected differences are within the threshold (e.g., a first number of scenarios 412(1) in which the controllers performed differently with respect to the first performance attribute 406(1) is indicated at zero).

Based on a determination that a difference in the metrics associated with a performance attribute is equal to or greater than the threshold difference, the simulation computing system may determine that the candidate controller performs differently than the control version. In some examples, the difference may be expected, such as based on an update to the controller to modify a behavior of the vehicle control. In such examples, the candidate controller may be validated based on the determined difference in performance between the candidate controller and the control version of the controller.

In some examples, the difference may not be expected, such as in examples in which the update to the controller was not expected to modify the behavior thereof or the expected control change (e.g., behavioral change) and the detected control change were not the same (e.g., not associated with a same component, a same performance attribute 406, or the like. In some examples, a determination that the candidate controller performs differently than the control version may result in a determination of invalidity, as described above.

As illustrated, based on a determination that the difference in the metrics associated with a particular performance attribute is equal to or greater than the threshold difference in one or more scenarios, the simulation computing system may cause a number of scenarios 412, such as number of scenarios 312, to be presented in the associated summary 410. For example, the simulation computing system may determine that the differences between the metrics associated with a second performance attribute 406(2) in 224 scenarios of the 648 total scenarios evaluated may be greater than the threshold. Accordingly, second summary 410(2) may include a second number of scenarios 412(2) indicating the 224 scenarios in which the differences in the metrics between the candidate version and the control version of the controller may exceed the threshold.

In some examples, a user may input a particular behavioral difference that should be expected based on an update to a controller. In such examples, the user may indicate to the simulation computing system that the particular behavioral difference (e.g., $1/648$ diff) is an acceptable and/or expected difference that may result in validation of the controller. Based on a determination that other behavioral differences are determined by the simulation computing system (e.g., other than the particularly enumerated behavioral difference), the simulation computing system and/or the user may determine to invalidate the controller.

Figure 5:
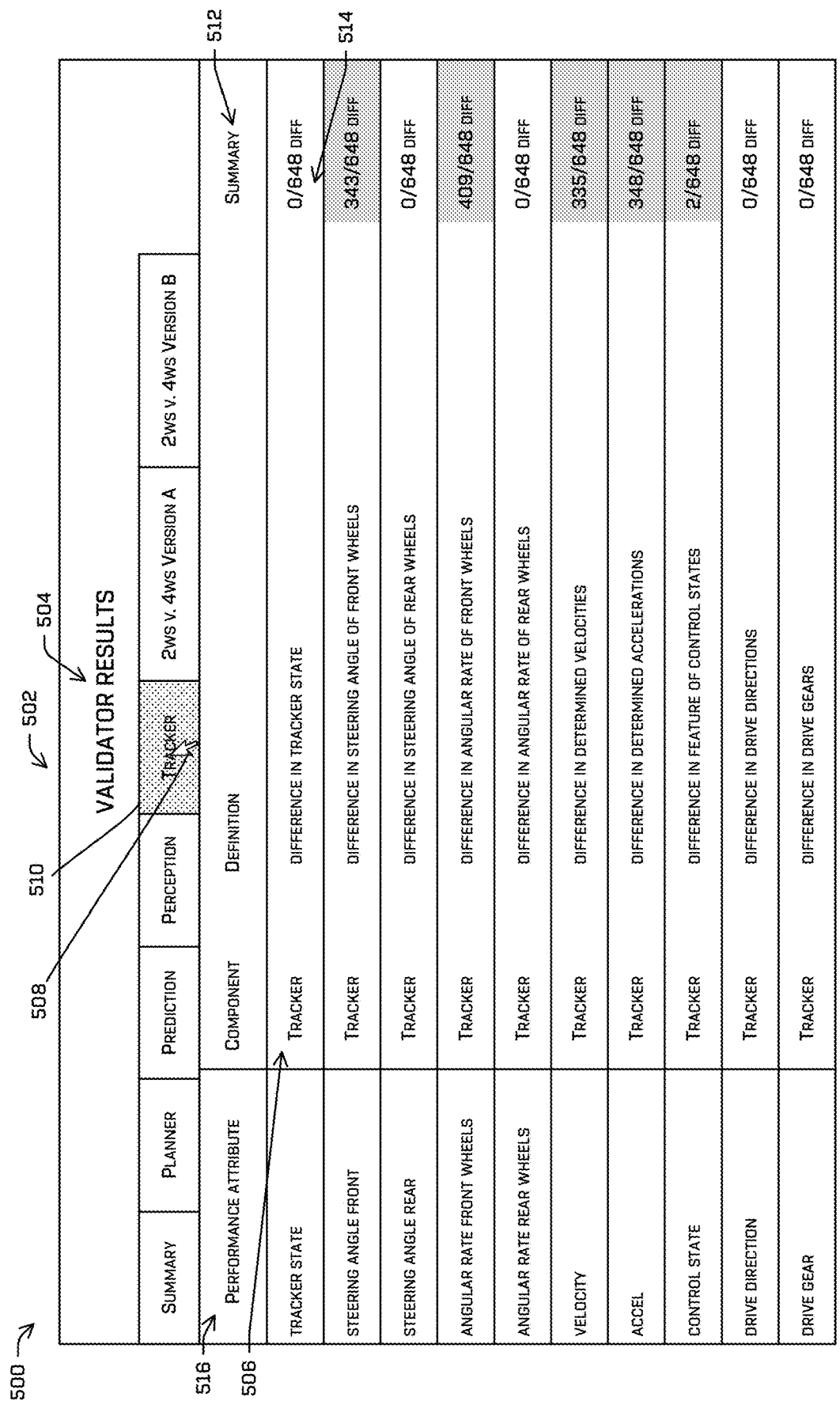
FIG. 5 is an example interface in which a summary of results of a performance evaluation associated with a tracker component of an autonomous controller may be displayed, in accordance with examples of this disclosure.

FIG. 5 is an example interface 500 illustrating a summary page 502, such as summary page 302 and summary page 402, including a summary of results 504 associated with a tracker component 506. In various examples, the simulation computing system may limit an evaluation of a candidate controller to an evaluation of the performance of the candidate controller associated with a particular component, such as the tracker component 506. In some examples, the limitation of the evaluation may be performed based on an input from a user 508, such as input received via a request submission page, such as request submission page 206. For example, a software developer may update a code associated with the tracker component 506 and may request to limit the evaluation to the tracker component 506 based on the update, such as to expedite the evaluation.

In various examples, based on an input associated with limiting the evaluation to a particular component, such as the tracker component 506, the simulation computing system may present the summary of results 504 associated with the tracker component 506 on the summary page 502. Alternatively, the simulation computing system may present the summary of results 504 associated with the tracker component responsive to an indication of selection of a tracker component tab 510, such as tracker component tab 308(5).

As described above, the tracker component tab 510 may include summaries 512, such as summaries 310 and 410 providing an indication of a number of scenarios 514 in which differences in metrics are determined in the evaluation per performance attribute 516.

Figure 6:
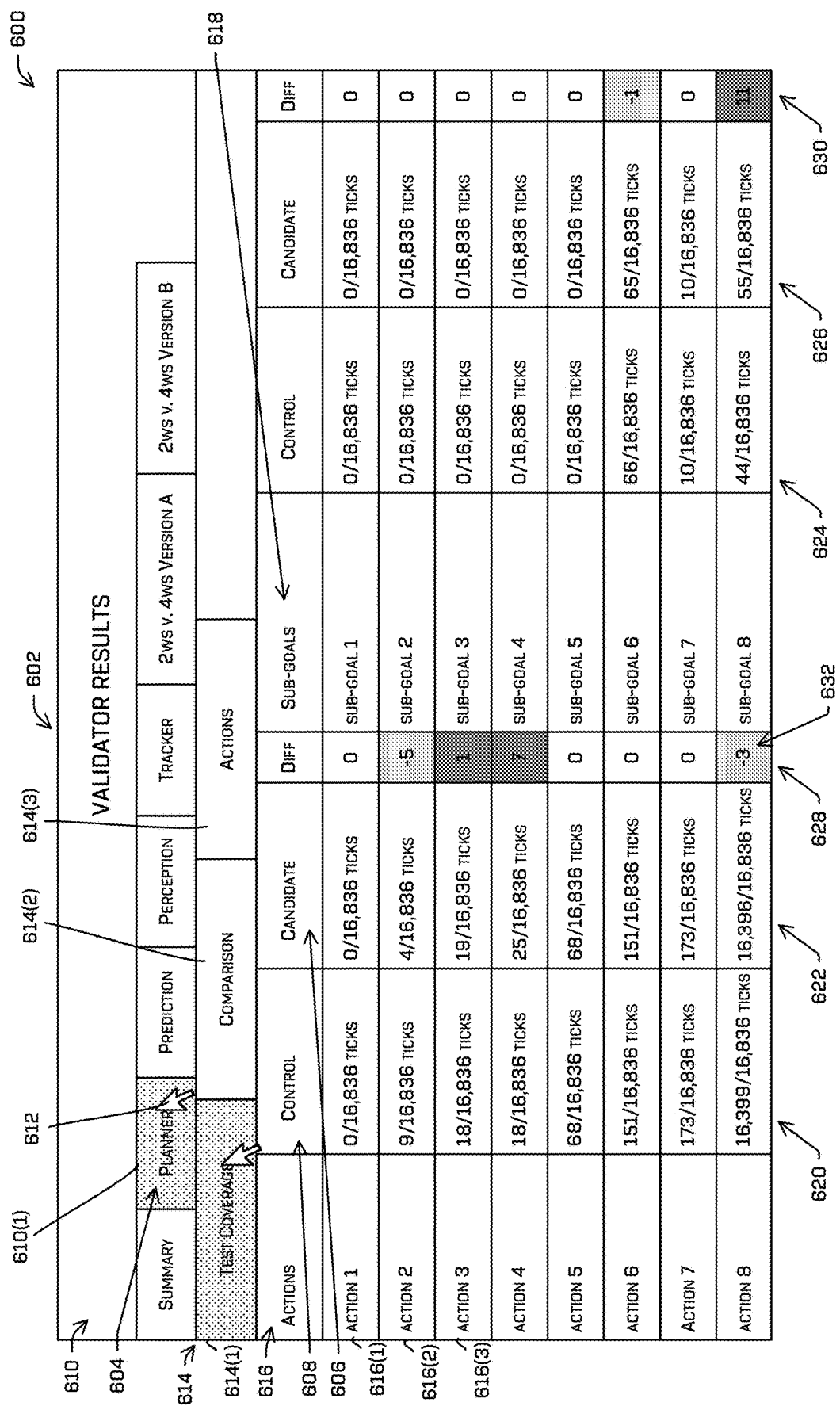
FIG. 6 is an example interface in which a coverage of a performance evaluation associated with a planner component of an autonomous controller may be displayed, in accordance with examples of this disclosure.

FIG. 6 is an example interface 600 illustrating a test coverage page 602 associated with a performance evaluation associated with a planner component 604 of a candidate controller 606, such as compared to a control version 608 of the controller. In various examples, the simulation computing system may limit an evaluation of a candidate controller 606 to an evaluation of the performance of the candidate controller 606 associated with a particular component, such as the planner component 604. In some examples, the simulation computing system may evaluate two or more components of the candidate controller 606. In such examples, the results associated with the evaluation of the component(s) may be accessible via tabs 610, such as tabs 308, 408, and 510. For example, the results associated with the planner component may be accessible via the planner component tab 610(1).

In various examples, based on an indication of selection of the planner component tab 610(1) by a user 612, one or more secondary tabs 614 associated with the planner component 604, may be presented. In the illustrative example, the secondary tab(s) 614 may include a test coverage tab 614(1), a comparison tab 614(2), and an action search statistics tab 614(3). In some examples, the secondary tab(s) 614 may include additional or alternative secondary tabs 614.

In some examples, based on an indication of selection of the test coverage tab 614(1), one or more actions 616 and sub-goals 618 associated with the planner component 604 may be presented via the test coverage page 602. In various examples, the action(s) 616 may include one or more movements (e.g., maneuvers) of the simulated vehicle as determined by the candidate controller 606 or the vehicle as determined by the control version 608, such as staying in a lane, a lane change, a merge, a speed variation (e.g., maintain velocity, accelerate, decelerate, etc.), a positional variation (e.g., changing a position in a lane), and the like. The sub-goals 618 may include an action that the candidate controller 606 and/or control version 608 is purposing to execute in control of the simulated vehicle or vehicle, respectively. For example, as a non-limiting example, sub-goals may include interactions with objects, interactions in particular areas (e.g., construction zone, school zone, etc.), aborting an action to yield to an object, or the like.

In some examples, a performance evaluation of the planner component 604 may be limited to a particular set of actions 616 and/or sub-goals 618. In some examples, the user 612 may include the set of actions 616 and/or sub-goals 618 to be evaluated in the performance evaluation request, such as that submitted via a request submission page (e.g., request submission page 206). In such examples, the simulation computing system may limit the evaluation to the set of actions 616 and/or sub-goals 618 identified in the request.

In some examples, each of the actions 616 and/or sub-goals 618 associated with the planner component 604 may be presented via the test coverage page 602. In various examples, the test coverage page may include a first number of instances 620 that a particular action 616 was exercised by the control version 608 during operation of the vehicle in the scenarios associated with a simulation and a second number of instances 622 that the particular action 616 was exercised by the candidate controller 606 in the simulation. Additionally or in the alternative, the test coverage page 602 may include a third number of instances 624 that a particular sub-goal 618 was exercised by the control version 608 and a fourth number of instances 626 that the particular sub-goal 618 was exercised by the candidate controller 606.

As illustrated in FIG. 6, the first number of instances 620 that the particular action 616 was exercised by control version 608 and the second number of instances 622 that the particular action 616 was exercised by candidate controller 606 (candidate controller 606) may include a number of times the particular action 616 was performed in association with various timestamps (illustrated as ticks) as compared to a total number of timestamps associated with the scenarios and/or the simulation. In some examples, the third number of instances 624 and the fourth number of instances 626 may also include the number of times the particular sub-goal 618 was performed in association with various timestamps as compared to the total number of timestamps. In at least one example, the candidate controller 606 and the control version 608 may be configured to determine the number of instances 620, 622, 624, and 626 that the actions 616 and/or sub-goals 618 were performed in association with timestamps throughout vehicle operation and/or throughout the simulation. In the illustrated example, the scenarios (e.g., the simulation and operation of the vehicle) combined include 16,836 timestamps. In other examples, the scenarios may include a greater or lesser number of timestamps. In at least one example, the timestamps may be associated with a periodic time interval (e.g., 0.1 seconds, 0.15 seconds, 0.2 seconds, etc.) throughout the scenarios.

In various examples, the simulation computing system may be configured to determine first differences 628 between the first number of instances 620 and the second number of instances 622 and second differences between the third number of instances 624 and the fourth number of instances 626. In various examples, the test coverage page 602 may include the first differences 628 and/or the second differences 630. In various examples, the simulation computing system may be configured to present an indicator 632 indicating that the second number of instances 622 differs from the first number of instances 620 with respect to particular actions 616 and/or the fourth number of instances 626 differ from the third number of instances 624 with respect to particular sub-goals 618. In the illustrative example, the indicator 632 includes a numerical value and/or a highlight emphasizing the first differences 628 and/or the second differences 630. In some examples, the numerical value may include a negative number to indicate a that the candidate controller 606 exercised the action 616 and/or sub-goal fewer times than the control version 608 and a positive number to indicate that the candidate controller 606 exercised the action 616 and/or sub-goal more times than the control version 608, or vice versa. In some examples, the indicator 632 includes a first color highlight associated with positive differences and a second color highlight associated with negative differences. In such examples, the simulation computing system may enable the user 612 to quickly and easily identify differences in performance between the candidate controller 606 and the control version 608.

In various examples, the simulation computing system may be configured to validate the candidate controller 606 and/or the planner component 604 thereof based on a determination that no differences (e.g., each of the first differences 628 have a value of zero and each of the second differences 630 have a value of zero) exist between the actions 616 and the sub-goals 618 performed by the candidate controller 606 and the control version 608. In some examples, the simulation computing system may be configured to validate the candidate controller 606 and/or the planner component 604 based on one or more determined negative differences. In such examples, the validation may be based on a decreased number of times the candidate controller 606 performs an action 616 and/or sub-goal 618. In some examples, the simulation computing system may be configured to validate the candidate controller 606 and/or the planner component 604 based on one or more determined positive differences. In such examples, the validation may be based on an increased number of times the candidate controller 606 performs an action 616 and/or sub-goal 618.

In various examples, an actions tab 610(3) may be associated with determined statistics associated with the actions determined by the planner component 604 in a simulation. In various examples, the statistics may include a number of actions considered, a time associated with determining an action, a number of times determined actions between the candidate version and the control version of the controller differ and/or were the same, an option to search actions and/or statistics associated with the candidate controller, the control version of the controller, and/or a plurality of other controllers, and/or other statistics associated with actions determined by the planner component 604.

In various examples, and as will be discussed below with respect to FIG. 7, the comparison tab 610(3) may include a presentation of values corresponding to differences in metrics associated with various actions 616 and/or sub-goals 618.

Figure 7:
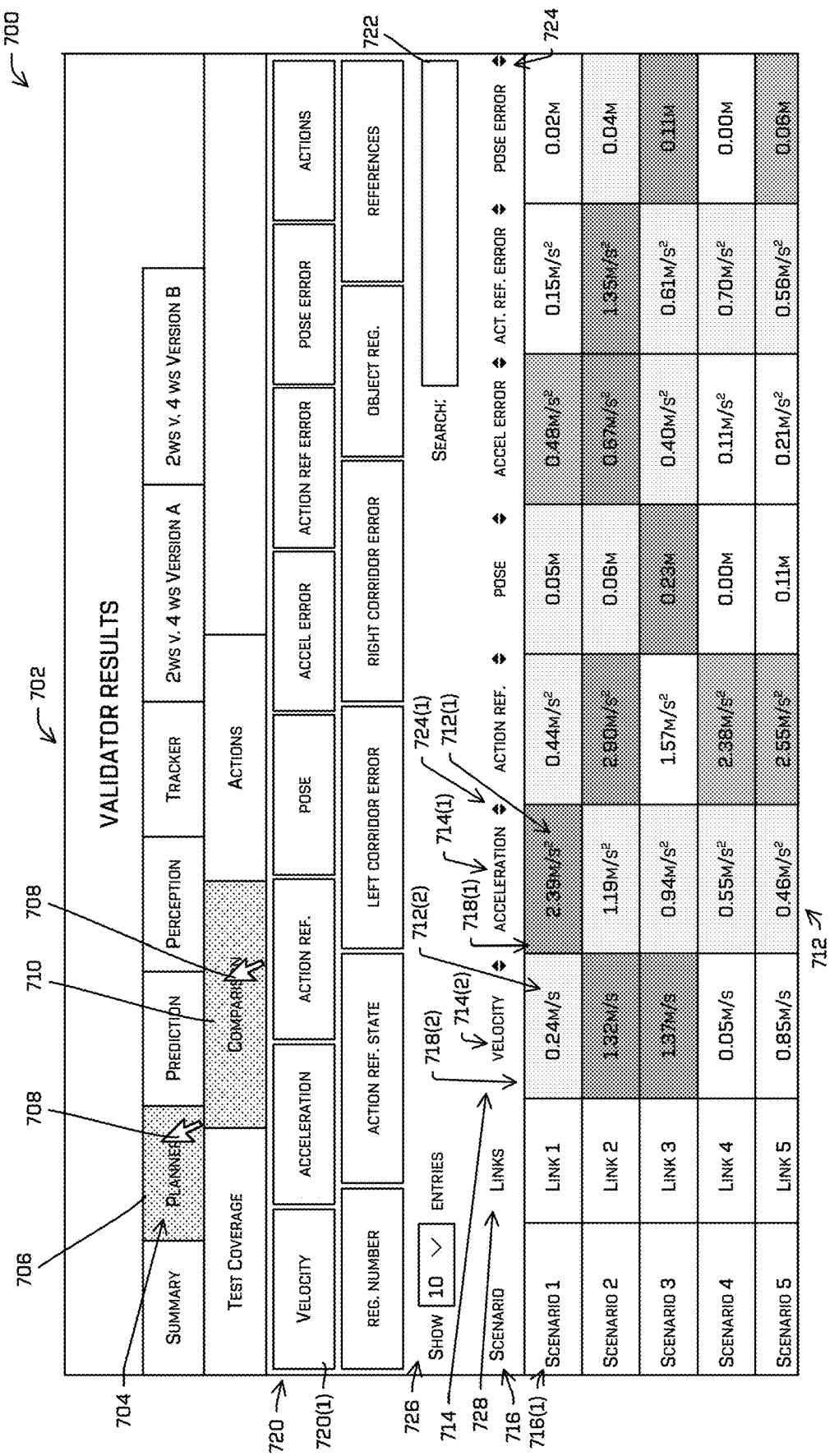
FIG. 7 is an example interface in which differences in performance attribute values determined in a performance evaluation between a first planner component of a first autonomous controller and a second planner component of a second autonomous controller may be displayed, in accordance with examples of this disclosure.

FIG. 7 is an example interface 700 illustrating a comparison page 702 associated with a performance evaluation associated with a planner component 704 of a candidate controller, such as compared to a control version of the controller. As discussed above, based on an indication of selection of a planner component tab 706, such as planner component tab 610(1), by a user 708, such as user 612, a comparison tab 710, such as comparison tab 614(2), may be presented via the interface 700. The comparison tab 710 may include values 712 representing maximum differences associated with the metrics of each performance attribute 714 in respective scenarios 716.

As discussed above, the simulation computing system may run a simulation to evaluate a performance of the candidate controller. The evaluation may include a comparison between metrics associated with performance attributes 714 (e.g., a number of determined points of a corridor corresponding to the vehicle path, velocities, accelerations, a number of determined actions, etc.). The simulation computing system may determine a difference between a first metric associated with the candidate controller and a second metric associated with the control version of the controller corresponding to each performance attribute 714. The simulation computing system may cause the values 712 to be presented via the comparison page 702. As a non-limiting examples, the performance attributes 714 may include a velocity difference (velocity), an acceleration difference (acceleration), an action reference difference (action ref), a positional difference (pose), an acceleration error (accel error), an action reference error (action ref error), a position error (pose error), number of actions (actions), number of registries (reg. number), action reference state (action ref. state), an error associated with corridor points on the left (left corridor error), an error associated with corridor points on the right (right corridor error), a difference in the registry of objects (object reg.), and a difference in a number of references (references).

In various examples, simulation computing system may present an indicator 718, such as indicator 632, to indicate whether the values 712 meet or exceed one or more threshold values. In some examples, the indicators 718 may include highlighting of different colors in association with different threshold values. In some examples, the indicators 718 may include a bolding or underlining of the value 712. In some examples, the indicators 718 may include symbols, such as a star, a flag, or other symbol indicating a threshold exceedance.

In some examples, the threshold values may be associated with a threshold difference in performance between the candidate controller and the control version. The threshold value(s) may be determined based on a particular performance attribute 714. For example, a first performance attribute 714(1) may have associated therewith one or more first threshold values and a second performance attribute 714(2) may have associated therewith one or more second threshold values. In some examples, the threshold value(s) may be determined based on an association of the particular performance attribute 714 with the planner component 604.

In some examples, the threshold value(s) may include a single value indicating that the performance of a particular attribute 714 in a particular scenario 716 exceeds a threshold and thus may not be validated. For example, the simulation computing system may determine that a first value 712(1) associated with a difference between a performance of a candidate controller and a control version of the controller with regard to a first performance attribute 714(1) associated with a first scenario 716(1) is 2.39 meters per second per second (m/s$^2$). The simulation computing system may determine that the value of 2.39 m/s$^2$ is equal to or greater than a threshold value for the first performance attribute 714(1) associated with the planner component 704. Based on the determination that the first value 712(1) is equal to or greater than the threshold value, the simulation computing system may cause the indicator 718(1) of a first color highlight to be presented via the comparison page 702.

In some examples, the performance attribute may have associated therewith two or more threshold values. In such examples, a first threshold value may indicate that the performance associated with the performance attribute 714 may not be validated and/or requires an update prior to incorporation of the candidate controller into the vehicle. In some examples, a second threshold value may be a threshold value that is lower than the first threshold value and indicates that the difference in performance associated with the performance attribute 714 is acceptable (e.g., validated) but may benefit from an update and/or adjustment. In such examples, the second threshold value may represent an indication to the user that an improvement to the programmatic logic of the candidate may be beneficial. For example, the simulation computing system may determine that a second value 712(2) associated with a difference between a performance of a candidate controller and a control version of the controller with regard to a second performance attribute 714(2) associated with a first scenario 716(1) is 0.24 meters per second (m/s). The simulation computing system may determine that the value of 0.24 m/s is less than a first threshold value for the second performance attribute 714(2) and equal to or greater than a second threshold value for the second performance attribute 714(2). Based on the determination that the second value 712(2) less than the first threshold value and equal to or greater than the second threshold value, the simulation computing system may cause a second indicator 718(2) of a second color highlight to be presented via the comparison page 702. In various examples, based on a determination that a particular value 712 is less than the first threshold value and/or the second threshold value, the simulation computing system may determine to not include an indicator 718 with the particular value 712.

In various examples, the comparison page 702 may be configured to enable the user 708 to view values 712 associated with particular performance attributes. In the illustrative example, the comparison page 702 includes selectable options 720 associated with the performance attributes 714. Responsive to the user selecting a particular selectable option 720, the values 712 associated therewith may be presented on the comparison page 702. For example, responsive to receiving an indication of selection of a first selectable option 720(1), values 712 associated with the second performance attribute 714(2) (velocity) may be presented via the comparison page 702, such as in a first column of one or more columns or as a single set of values 712 presented. In such examples, the user 708 may be able to quickly and easily access data associated with a particular performance attribute, such as to determine whether a software update thereto modifies a behavior of the candidate controller as compared to the control version thereof. In various examples, the comparison page 702 may include a search input box 722 via which the user 708 may search for a particular performance attribute 714 of interest.

Additionally or in the alternative, the comparison page 702 may be configurable by the user 708 to view values 712 associated with performance attributes 714 in a sequential order, such as based on a value 712 associated therewith. In such examples, one or more performance attributes 714 may have associated therewith controllers 724 for modifying the view of the metrics differences. For example, responsive to a selection of a first controller 724 associated with the first performance attribute 714(1), the values 712 associated therewith may be presented in numerical order, such as with a largest difference presented first, or vice versa.

In some examples, the comparison page 702 may be further configurable by the user 708 to view a particular number of scenarios 716 and/or performance attributes 714. For example, the comparison page 702 may include an input box 726 via which the user 708 may modify a number of entries (e.g., number of scenarios 716, performance attributes 714, etc.) presented via the comparison page 702.

Figure 8:
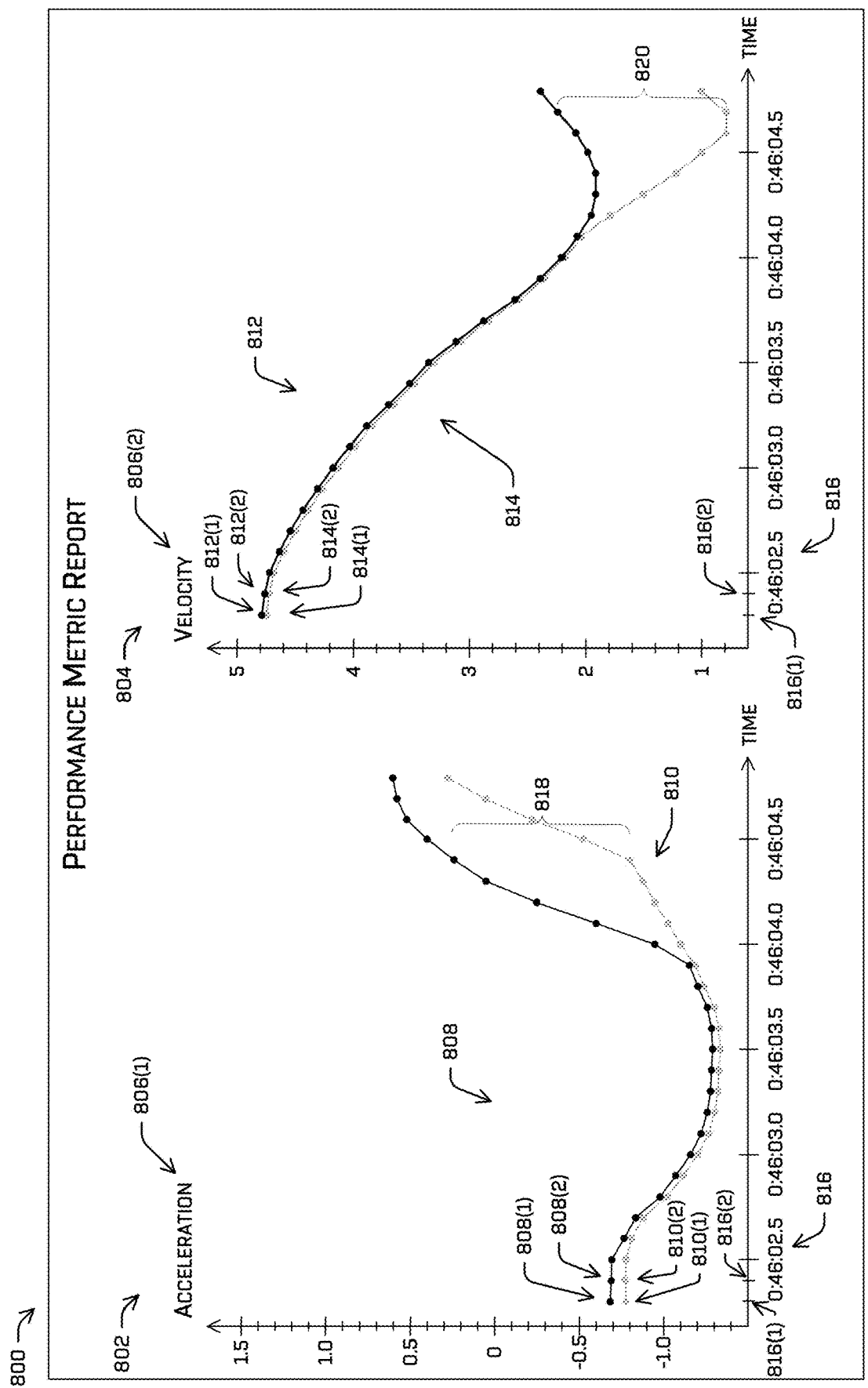
FIG. 8 is an example performance metric report including charts associated with performance metrics associated with an operation of a vehicle controlled by a first autonomous controller and an operation of a simulated vehicle controlled by a second autonomous controller, in accordance with examples of this disclosure.

In various examples, the comparison page 702 may include one or more links 728 associated with a report including performance metrics corresponding to the candidate version and/or the control version, such as that illustrated in FIG. 8.

FIG. 8 illustrates an example performance metric report 800 including a first chart 802 and a second chart 804 illustrating performance metrics associated with a candidate controller operating in a simulated vehicle in a simulation and a control version of the controller operating a vehicle in an environment. Though the illustrated performance metric report 800 (e.g., report 800) includes two charts, a first chart 802 associated with a first performance attribute 806(1), such as first performance attribute 714(1) and the second chart 804 associated with a second performance attribute 806(2), such as second performance attribute 714(2), this is merely for illustrative purposes, and it is understood that the report 800 may include a greater or lesser number of charts. For example, the report 800 may include a chart associated with each performance attribute 806 included in the evaluation.

In the illustrative example, the first chart 802 includes a visual illustration of accelerations 808 associated with the simulated vehicle (simulated vehicle accelerations 808) as controlled by the candidate controller and accelerations 810 associated with the vehicle (vehicle accelerations 810) as controlled by the control version throughout the scenarios and the second chart 802 includes a visual illustration of velocities 812 associated with the simulated vehicle (simulated vehicle velocities 812) and velocities 814 associated with the vehicle (vehicle velocities 814) throughout the scenarios. Though illustrated as being associated with a limited time period of a few seconds, it is understood that the charts may include data associated with the all or part of the simulation or operation of the vehicle associated with the scenarios. In various examples, the portion (e.g., time period) of the simulation or operation illustrated in the charts 802 and/or 804 may include a time period associated with a largest difference between values (e.g., largest difference in velocities or accelerations) associated with the simulation and/or operation.

The simulated vehicle accelerations 808 and the vehicle accelerations 810 may include respective accelerations of the simulated vehicle and the vehicle at associated timestamps 816 corresponding to the scenarios. The simulated vehicle velocities 812 and the vehicle velocities 812 may include respective velocities of the simulated vehicle and the vehicle at the associated timestamps 816 corresponding to the scenarios. For example, a first simulated vehicle acceleration 808(1) and a first vehicle acceleration 810(1) may be associated with a first timestamp 816(1) and a second simulated vehicle acceleration 808(2) and a second vehicle acceleration 810(2) may be associated with a second timestamp 816(2). For another example, a first simulated vehicle velocity 812(1) and a first vehicle velocity 814(1) may be associated with the first timestamp 816(1) and a second simulated vehicle velocity 812(2) and a second vehicle velocity 814(2) may be associated with the second timestamp 816(2).

The timestamps 816 may be associated with a periodic time interval (e.g., 0.1 second, 0.2 seconds, 0.5 seconds, etc.). In the illustrative example, sample simulated vehicle accelerations 808 and vehicle accelerations 810 and sample velocities 812 and 814 may be determined at 0.1 second intervals. However this is not intended to be so limiting and other time intervals are contemplated herein.

In various examples, the simulation computing system may be configured to determine the values associated with a difference between accelerations and velocities of the simulated vehicle and the vehicle at various timestamps. In some examples, the simulation computing system may be configured to determine a maximum or root mean square value associated with the performance attributes 806(1) and 806(2), such as values 712(1) and 712(2) of FIG. 7 based on a comparison between the simulated vehicle accelerations 808 and the vehicle accelerations 810, a comparison between the simulated vehicle velocities 812 and the vehicle velocities 814, and the like. For example, the maximum difference associated with the acceleration in a scenario may be represented as maximum acceleration difference 818 (acceleration). In such an example, the maximum difference may include the largest disparity between a simulated vehicle acceleration 808 a vehicle acceleration 810 at a particular timestamp 816. For another example, the maximum difference associated with the velocity in a scenario may be represented as maximum velocity difference 820 (velocity). In such an example, the maximum difference may include the largest disparity between a simulated vehicle velocity 812 and a vehicle velocity at a particular timestamp 816.

FIG. 9 is an example interface 900 illustrating a configuration comparison page 902 in which results of a performance evaluation of a controller in different configurations may be presented. The performance evaluation of the controller may represent a performance of a controller to control a vehicle (or simulated vehicle) in different, related, configurations. In the illustrative example, the configurations include a first configuration 904 including a two-wheel steering configuration and a second configuration 906 including a four-wheel steering configuration. In some examples, the controller may be configured to control the vehicle and/or simulated vehicle in additional or alternative configurations.

In various examples, the simulation computing system may be configured to present the configuration comparison page 902 responsive to an input via a request submission page, such as request submission page 206, to limit an evaluation of an autonomous controller to a comparison between different configurations. In various examples, the input may include an input via a configuration evaluation selectable option, such as configuration evaluation selectable option 218, via which a user may request an evaluation of a performance of a controller in different configurations, such as two-wheel steering configuration (first configuration 904) and the four-wheel steering configuration (second configuration 906). In such examples, the user may limit an extent of the evaluation, thereby reducing an amount of time to perform the evaluation and/or an amount of processing power and memory required by the simulation computing system to perform the evaluation.

In various examples, the simulation computing system may perform a comparison between the first configuration 904 and the second configuration 906 as part of an evaluation of the autonomous controller (e.g., a complete evaluation of all components and/or configurations). In such examples, the simulation computing system may generate the configuration comparison page 902 in an overall candidate controller evaluation. In some examples, the configuration comparison page 902 may be viewable based on a selection of a tab associated therewith, such as tab 308(6) to view differences between metrics associated with a comparison of a first version of the controller (version A) and/or tab 308(7) to view differences between metrics associated with a comparison of a second version of the controller (version B).

In various examples, the simulation computing system may determine one or more scenarios 908 associated with an evaluation of the controller with respect to a configuration change. In some examples, the simulation computing system may determine the scenarios based on one or more predetermined sets of scenarios. In some examples, the simulation computing system may determine the scenario(s) based on user input, such as via the request submission page. In some examples, the scenarios 908 may include a same set of scenarios used to test components of the controller. In some examples, the simulation computing system may determine a particular set of scenarios 910 associated with evaluating the performance of the controller with respect to a configuration modification. In the illustrative example, the set of scenarios 910 may include ten scenarios. In other examples, the set of scenarios 910 may include a greater or lesser number of scenarios. In at least one example, the simulation computing system may determine the scenarios associated with evaluation the controller with respect to differences in controlling a vehicle in two-wheel steering versus controlling the vehicle in four-wheel steering based on scenarios that include the use of a tight turn, such as scoop parking, construction zone interactions, cut in actions, lane change merges, maneuvering around double-parked vehicles, interactions with pedestrian jaywalkers, and the like.

In various examples, the configuration comparison page 902 may include values 912, such as values 712, representing differences in metrics associated with performance attributes 914 associated with a steering system. As a non-limiting example, the performance attributes 914 include a decision error (in meters or feet), a projected heading error, a projected lateral error, a projected velocity error, and/or a non-expected heading error difference. In other examples, the performance attributes may include a greater or lesser number of attributes to be compared between the control of the controller in the first configuration 904 and the second configuration 906.

In various examples, simulation computing system may present an indicator 916, such as indicator 632, to indicate whether the values 912 meet or exceed one or more threshold values. In some examples, the indicators 916 may include highlighting of different colors in association with different threshold values. In some examples, the indicators 916 may include a bolding or underlining of the value 912. In some examples, the indicators 916 may include symbols, such as a star, a flag, or other symbol indicating a threshold exceedance. In some examples, the threshold value(s) may be determined based on a particular performance attribute 914. In some examples, the threshold value(s) may be determined based on an association of a configuration evaluation.

In various examples, the configuration comparison page 902 may be configurable by a user to view values 912 associated with a performance attributes 914 in a sequential order, such as based on a value 912 associated therewith. In such examples, one or more performance attributes 914 may have associated therewith controllers 918 for modifying the view of the values 912 (e.g., metrics differences). In various examples, the configuration comparison page 902 may include one or more links 920 associated with a report including performance metrics corresponding to the particular version of the controller evaluated (e.g., candidate version or the control version) in the different configurations. In various examples, the links 920 may include links to a report, such as report 800 of FIG. 8, including comparisons of metrics associated with control of the vehicle or simulated vehicle in the first configuration 904 and the second configuration 906.

Figure 10:
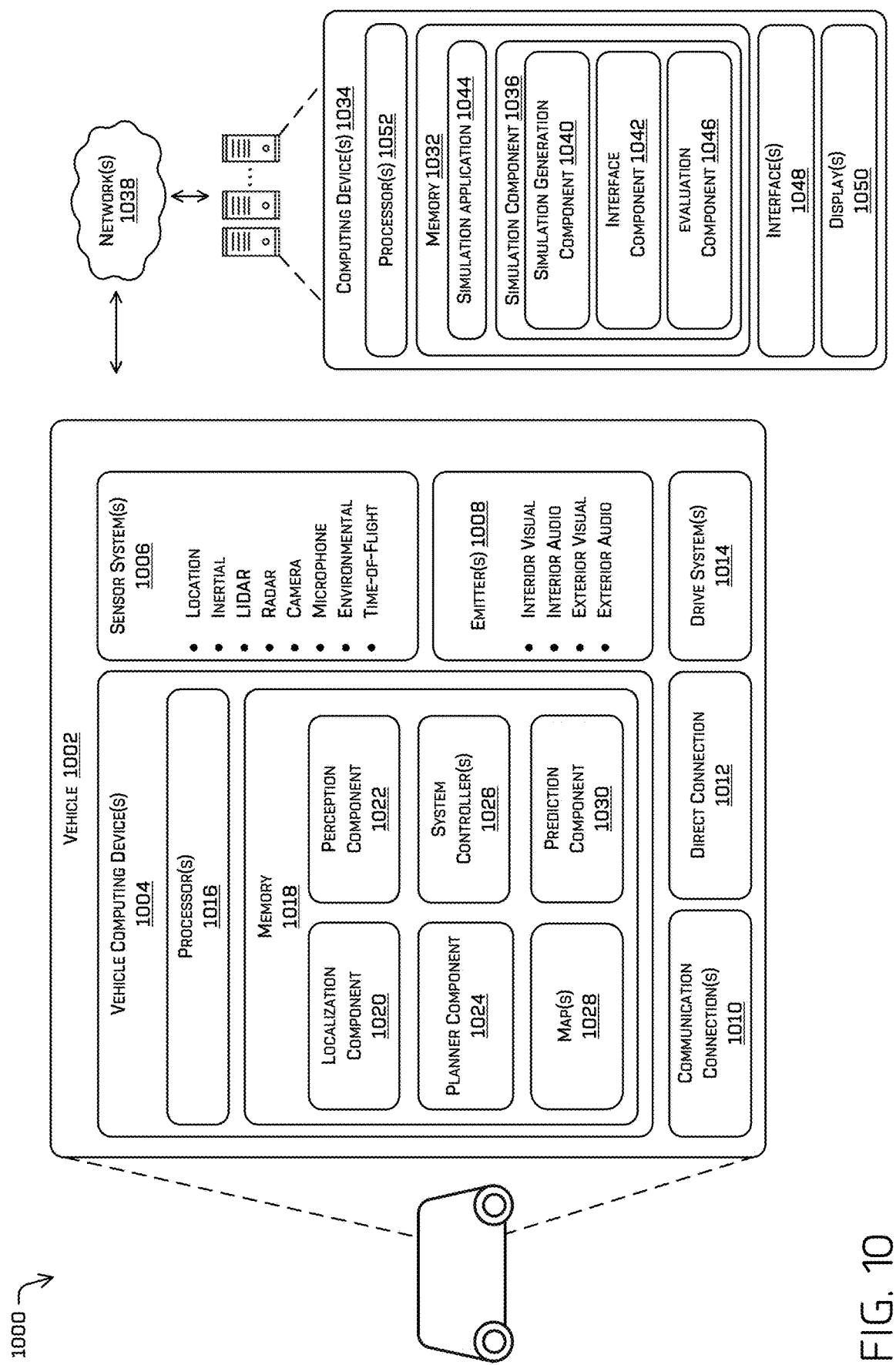
FIG. 10 is a block diagram of an example system for implementing the techniques described herein.

FIG. 10 is a block diagram of an example system 1000 for implementing the techniques described herein. In at least one example, the system 1000 may include a vehicle 1002, such as vehicle 104. In some examples, a simulated vehicle, such as simulated vehicle 136 may represent a simulation of the vehicle 1002 operating in a simulation.

The vehicle 1002 may include one or more vehicle computing devices 1004, one or more sensor systems 1006, one or more emitters 1008, one or more communication connections 1010, at least one direct connection 1012, and one or more drive systems 1014.

The vehicle computing device(s) 1004 may include one or more processors 1016 and memory 1018 communicatively coupled with the one or more processors 1016. In the illustrated example, the vehicle 1002 is an autonomous vehicle; however, the vehicle 1002 could be any other type of vehicle, such as a semi-autonomous vehicle, or any other system having at least an image capture device (e.g., a camera enabled smartphone). In the illustrated example, the memory 1018 of the vehicle computing device(s) 1004 stores a localization component 1020 (e.g., tracker component), a perception component 1022, a planning component 1024, one or more system controllers 1026, one or more maps 1028, and a prediction component 1030. Though depicted in FIG. 10 as residing in the memory 1018 for illustrative purposes, it is contemplated that the localization component 1020, a perception component 1022, a planning component 1024, one or more system controllers 1026, one or more maps 1028, and the prediction component 1030 may additionally, or alternatively, be accessible to the vehicle 1002 (e.g., stored on, or otherwise accessible by, memory remote from the vehicle 1002, such as, for example, on memory 1032 of one or more computing devices 1034). For example, the memory 1032 may store a simulation component 1036 accessible by the planning component 1024 of the vehicle 1002.

In at least one example, the localization component 1020 may include functionality to receive data from the sensor system(s) 1006 to determine a position and/or orientation of the vehicle 1002 (e.g., one or more of an x-, y-, z-position, roll, pitch, or yaw). For example, the localization component 1020 may include and/or request/receive a map of an environment, such as from map(s) 1028, and may continuously determine a location and/or orientation of the autonomous vehicle within the map. In some instances, the localization component 1020 may utilize SLAM (simultaneous localization and mapping), CLAMS (calibration, localization and mapping, simultaneously), relative SLAM, bundle adjustment, nonlinear least squares optimization, or the like to receive image data, lidar data, radar data, IMU data, GPS data, wheel encoder data, and the like to accurately determine a location of the autonomous vehicle. In some instances, the localization component 1020 may provide data to various components of the vehicle 1002 to determine an initial position of an autonomous vehicle for determining the relevance of an object to the vehicle 1002, as discussed herein.

In some examples, the perception component 1022 may include functionality to perform object detection, segmentation, and/or classification. In some examples, the perception component 1022 may provide processed sensor data that indicates a presence of an object (e.g., entity) that is proximate to the vehicle 1002 and/or a classification of the object as an object type (e.g., car, pedestrian, cyclist, animal, building, tree, road surface, curb, sidewalk, unknown, etc.). In some examples, the perception component 1022 may provide processed sensor data that indicates a presence of a stationary entity that is proximate to the vehicle 1002 and/or a classification of the stationary entity as a type (e.g., building, tree, road surface, curb, sidewalk, unknown, etc.). In additional or alternative examples, the perception component 1022 may provide processed sensor data that indicates one or more characteristics associated with a detected object (e.g., a tracked object) and/or the environment in which the object is positioned. In some examples, characteristics associated with an object may include, but are not limited to, an x-position (global and/or local position), a y-position (global and/or local position), a z-position (global and/or local position), an orientation (e.g., a roll, pitch, yaw), an object type (e.g., a classification), a velocity of the object, an acceleration of the object, an extent of the object (size), etc. Characteristics associated with the environment may include, but are not limited to, a presence of another object in the environment, a state of another object in the environment, a time of day, a day of a week, a season, a weather condition, an indication of darkness/light, etc.

In general, the planning component 1024 may determine a path for the vehicle 1002 to follow to traverse through an environment. For example, the planning component 1024 may determine various routes and vehicle trajectories and various levels of detail. For example, the planning component 1024 may determine a route to travel from a first location (e.g., a current location) to a second location (e.g., a target location). For the purpose of this discussion, a route may include a sequence of waypoints for travelling between two locations. As non-limiting examples, waypoints include streets, intersections, global positioning system (GPS) coordinates, etc. Further, the planning component 1024 may generate an instruction for guiding the autonomous vehicle 1002 along at least a portion of the route from the first location to the second location. In at least one example, the planning component 1024 may determine how to guide the autonomous vehicle from a first waypoint in the sequence of waypoints to a second waypoint in the sequence of waypoints. In some examples, the instruction may be a vehicle trajectory, or a portion of a trajectory. In some examples, multiple trajectories may be substantially simultaneously generated (e.g., within technical tolerances) in accordance with a receding horizon technique, wherein one of the multiple trajectories is selected for the vehicle 1002 to navigate.

In at least one example, the vehicle computing device(s) 1004 may include one or more system controllers 1026, which may be configured to control steering, propulsion, braking, safety, emitters, communication, and other systems of the vehicle 1002. The system controller(s) 1026 may communicate with and/or control corresponding systems of the drive system(s) 1014 and/or other components of the vehicle 1002.

The memory 1018 may further include one or more maps 1028 that may be used by the vehicle 1002 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map may include, but is not limited to: texture information (e.g., color information (e.g., RGB color information, Lab color information, HSV/HSL color information), and the like), intensity information (e.g., lidar information, radar information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map may include a three-dimensional mesh of the environment. In some examples, the vehicle 104 may be controlled based at least in part on the map(s) 1028. That is, the map(s) 1028 may be used in connection with the localization component 1020, the perception component 1022, and/or the planning component 1024 to determine a location of the vehicle 1002, detect objects in an environment, generate routes, determine actions and/or trajectories to navigate within an environment.

In some examples, the one or more maps 1028 may be stored on a remote computing device(s) (such as the computing device(s) 1034) accessible via one or more networks 1038. In some examples, multiple maps 1028 may be stored based on, for example, a characteristic (e.g., type of entity, time of day, day of week, season of the year, etc.). Storing multiple maps 1028 may have similar memory requirements, but increase the speed at which data in a map may be accessed.

As illustrated, the vehicle computing device(s) 1004 may include a prediction component 1030. The prediction component 1030 may be configured to predict one or more predicted object trajectories associated with a detected object in an environment, such as based on sensor data. The object trajectories may be determined using a probabilistic heat map (e.g., discretized probability distribution) to predict object behavior, such as those described in U.S. patent application Ser. No. 15/807,521, filed Nov. 8, 2017, and entitled "Probabilistic Heat Maps for Behavior Prediction," and the U.S. Pat. No. 10,671,076, issued Jun. 2, 2020, and entitled "Trajectory Prediction of Third-Party Objects Using Temporal Logic and Tree Search," the entire contents of which are incorporated herein by reference. In some examples, the one or more predicted object trajectories may be based on a top-down representation of an environment of the vehicle 1002 (or simulated vehicle), such as by utilizing the techniques such as those described in U.S. patent application Ser. No. 16/151,607 filed Oct. 4, 2018 and entitled "Trajectory Prediction on Top-Down Scenes," and in U.S.

patent application Ser. No. 16/504,147 filed Jul. 5, 2019 and entitled "Prediction on Top-Down Scenes based on Action Data," the entire contents of which are incorporated herein by reference. In various examples, the one or more predicted object trajectories may be determined utilizing tree search methods, temporal logic formulae, and/or machine learning techniques. In various examples, the autonomous controller may utilize the object data including the predicted object trajectories and/or the top-down representation of the environment to control the vehicle.

As can be understood, the components discussed herein (e.g., the localization component 1020, the perception component 1022, the planning component 1024, the one or more system controllers 1026, the one or more maps 1028, and the prediction component 1030 are described as divided for illustrative purposes. However, the operations performed by the various components may be combined or performed in any other component. In various examples, as described herein the controller may include one or more of the localization component 1020, the perception component 1022, the planning component 1024, the one or more system controllers 1026, the one or more maps 1028, and the prediction component 1030, such as to process data associated with each component and control the vehicle based in part on the data.

In some instances, aspects of some or all of the components discussed herein may include any models, techniques, and/or machine learning techniques. For example, in some instances, the components in the memory 1018 (and the memory 1032, discussed below) may be implemented as a neural network.

As described herein, an exemplary neural network is a biologically inspired technique which passes input data through a series of connected layers to produce an output. Each layer in a neural network may also comprise another neural network, or may comprise any number of layers (whether convolutional or not). As can be understood in the context of this disclosure, a neural network may utilize machine learning, which may refer to a broad class of such techniques in which an output is generated based on learned parameters.

Although discussed in the context of neural networks, any type of machine learning may be used consistent with this disclosure. For example, machine learning techniques may include, but are not limited to, regression techniques (e.g., ordinary least squares regression (OLSR), linear regression, logistic regression, stepwise regression, multivariate adaptive regression splines (MARS), locally estimated scatterplot smoothing (LOESS)), instance-based techniques (e.g., ridge regression, least absolute shrinkage and selection operator (LASSO), elastic net, least-angle regression (LARS)), decisions tree techniques (e.g., classification and regression tree (CART), iterative dichotomiser 3 (ID3), Chi-squared automatic interaction detection (CHAID), decision stump, conditional decision trees), Bayesian techniques (e.g., naïve Bayes, Gaussian naïve Bayes, multinomial naïve Bayes, average one-dependence estimators (AODE), Bayesian belief network (BNN), Bayesian networks), clustering techniques (e.g., k-means, k-medians, expectation maximization (EM), hierarchical clustering), association rule learning techniques (e.g., perceptron, back-propagation, hopfield network, Radial Basis Function Network (RBFN)), deep learning techniques (e.g., Deep Boltzmann Machine (DBM), Deep Belief Networks (DBN), Convolutional Neural Network (CNN), Stacked Auto-Encoders), Dimensionality Reduction Techniques (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Techniques (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet50, ResNet101, VGG, DenseNet, PointNet, and the like.

In the illustrative example, the computing device(s) 1034 may include a simulation component 1036. The simulation components 1036 may be configured to generate simulations for evaluating a performance of an autonomous controller. For the purposes of this discussion, the autonomous controller may include a controller configured to perform the functions of one or more of the localization component 1020, perception component 1022, and planning component 1024, and the prediction component 1030 of the vehicle computing device(s) 1004. In other words, the autonomous controller may be configured to control the vehicle 1002.

The simulation component 1036 may include a simulation generation component 1040 configured to generate one or more simulations based on a request to validate (e.g., evaluate) a controller (e.g., an autonomous controller). In various examples, the request may be received based on a user input via an interface component 1042, such as a component associated with user interface 112, and/or based on an instruction to periodically evaluate a controller. In various examples, the computing device 1034 may include a simulation application 1044 configured to process data received via the interface component 1042 and/or to provide results to a user. In at least one example, a computing device of the one or more computing devices 1034 includes a user computing device. In such examples, the user computing device may include a client simulation application 1044.

In various examples, the simulation generation component 1040 may generate the simulation based on input received via the interface component 1042 and/or the simulation application 1044. In some examples, the input may include an identifier associated with the candidate controller, an identifier associated with the control version of the controller, labels associated with the candidate controller and/or the control version of the controller, a set of scenarios to utilize for the simulation, a location associated with a storage of the set of scenarios, a number of scenarios to be included in the simulation, a percentage of a pre-determined set of scenarios to be included in the simulation, a time duration (e.g., time limitation) of the simulation, and/or a particular pre-determined set of scenarios and/or type thereof to be included in the simulation. As discussed above, the simulation generation component 1040 may be configured to generate the simulation based on pre-determined data (e.g., a pre-determined set of scenarios, an on-board version of the controller) and/or input provided via the interface component 1042 and/or the simulation application 1044.

In various examples, an evaluation component 1046 may be configured to run the simulation with the candidate controller controlling a simulated vehicle and to determine metrics corresponding to performance attributes of the controller. The evaluation component 1046 may compare metrics associated with the candidate controller controlling the simulated vehicle and metrics associated with the control version of the controller controlling the vehicle, such as based on a previous operation of the vehicle and/or a second instantiation of the simulation with the control version of the controller controlling a second simulated vehicle. In various examples, the evaluation component 1046 may be configured to determine whether the differences associated with the metrics meet or exceed a threshold value, such as described above. In various examples, the evaluation component 1046 may be configured to present data associated with the evaluation, such as an indication of validation, an indication of invalidation, data associated with a summary pages 302, 402, 502, test coverage page 602, comparison page 702, performance metric report 800, and/or configuration comparison page 902.

In various examples, the evaluation component 1046 may be configured to provide the data to a user, such as via an interface component 1042 and/or via the client simulation application 1044 based on an indication of completion of a performance evaluation of a controller.

In various examples, the computing device(s) 1034 may include one or more input/output (I/O) devices, such as via one or more interfaces 1048 of the computing device(s) 1034. The interface(s) 1048 may include I/O interfaces and/or network interfaces. The I/O interface(s) may include speakers, a microphone, a camera, and various user controls (e.g., buttons, a joystick, a keyboard, a keypad, etc.), a haptic output device, and so forth. The network interface(s) may include one or more interfaces and hardware components for enabling communication with various other devices over the network or directly. For example, network interface(s) may enable communication through one or more of the Internet, cable networks, cellular networks, wireless networks (e.g., Wi-Fi) and wired networks, as well as close-range communications such as Bluetooth®, Bluetooth® low energy, and the like, as additionally enumerated elsewhere herein.

In some examples, a user may view the user interfaces associated with the simulation component 1036 and/or the simulation application 1044, such as to input data and/or view results via one or more displays 1050. Depending on the type of computing device, such as a user computing device, server computing device, or the like, the display 1050 may employ any suitable display technology. For example, the display 1050 may be a liquid crystal display, a plasma display, a light emitting diode display, an OLED (organic light-emitting diode) display, an electronic paper display, or any other suitable type of display able to present digital content thereon. In some examples, the display 1050 may have a touch sensor associated with the display 1050 to provide a touchscreen display configured to receive touch inputs for enabling interaction with a graphical user interface presented on the display 1050. Accordingly, examples herein are not limited to any particular display technology.

The vehicle 1002 may also include one or more emitters 1008 for emitting light and/or sound. The emitters 1008 may include interior audio and visual emitters to communicate with passengers of the vehicle 1002. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 1008 may also include exterior emitters. By way of example and not limitation, the exterior emitters may include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 1002 may also include one or more communication connections 1010 that enable communication between the vehicle 1002 and one or more other local or remote computing device(s). For instance, the communication connection(s) 1010 may facilitate communication with other local computing device(s) on the vehicle 1002 and/or the drive system(s) 1014. Also, the communication connection(s) 1010 may allow the vehicle to communicate with other nearby computing device(s) (e.g., computing device(s) 1034, other nearby vehicles, etc.).

The communications connection(s) 1010 may include physical and/or logical interfaces for connecting the vehicle computing device(s) 1004 to another computing device or a network, such as network(s) 1038. For example, the communications connection(s) 1010 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.) or any suitable wired or wireless communications protocol that enables the respective computing device to interface with the other computing device(s) 1034.

In at least one example, the vehicle 1002 may include one or more drive systems 1014. In some examples, the vehicle 1002 may have a single drive system 1014. In at least one example, if the vehicle 1002 has multiple drive systems 1014, individual drive systems 1014 may be positioned on opposite ends of the vehicle 1002 (e.g., the front and the rear, etc.). In at least one example, the drive system(s) 1014 may include one or more sensor systems to detect conditions of the drive system(s) 1014 and/or the surroundings of the vehicle 1002. By way of example and not limitation, the sensor system(s) may include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive module, cameras or other image sensors, ultrasonic sensors to acoustically detect objects in the surroundings of the drive module, lidar sensors, radar sensors, etc. Some sensors, such as the wheel encoders may be unique to the drive system(s) 1014. In some cases, the sensor system(s) on the drive system(s) 1014 may overlap or supplement corresponding systems of the vehicle 1002 (e.g., sensor system(s) 1006).

The drive system(s) 1014 may include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 1014 may include a drive module controller which may receive and preprocess data from the sensor system(s) and to control operation of the various vehicle systems. In some examples, the drive module controller may include one or more processors and memory communicatively coupled with the one or more processors. The memory may store one or more systems to perform various functionalities of the drive system(s) 1014. Furthermore, the drive system(s) 1014 may also include one or more communication connection(s) that enable communication by the respective drive module with one or more other local or remote computing device(s).

In at least one example, the direct connection 1012 may provide a physical interface to couple the one or more drive system(s) 1014 with the body of the vehicle 1002. For example, the direct connection 1012 may allow the transfer of energy, fluids, air, data, etc. between the drive system(s) 1014 and the vehicle. In some instances, the direct connection 1012 may further releasably secure the drive system(s) 1014 to the body of the vehicle 1002.

In at least one example, the localization component 1020, the perception component 1022, the planning component 1024, the one or more system controllers 1026, the one or more maps 1028, and the prediction component 1030, may process data (e.g., sensor data, simulation data), as described above, and may send their respective outputs, over the one or more network(s) 1038, to the computing device(s) 1034. In at least one example, the localization component 1020, the perception component 1022, the planning component 1024, the one or more system controllers 1026, the one or more maps 1028, and the prediction component 1030, may send their respective outputs to the computing device(s) 1034 at a particular frequency, after a lapse of a predetermined period of time, in near real-time, etc.

In some examples, the vehicle 1002 may send sensor data to the computing device(s) 1034 via the network(s) 1038. In some examples, the vehicle 1002 may receive sensor data from the computing device(s) 1034 and/or one or more remote sensor systems via the network(s) 1038. The sensor data may include raw sensor data and/or processed sensor data and/or representations of sensor data. In some examples, the sensor data (raw or processed) may be sent and/or received as one or more log files.

The computing device(s) 1034 may include one or more processors 1052 and a memory 1032 storing the simulation component 1036. The processor(s) 1016 of the vehicle 1002 and the processor(s) 1052 of the computing device(s) 1034 may be any suitable processor capable of executing instructions to process data and perform operations as described herein. By way of example and not limitation, the processor(s) 1016 and 1052 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions. In at least one example, the simulation generation component 1040 may generate the simulation based on a particular version of GPU associated with the control version of the controller (e.g., GPU associated with the vehicle computing device 1004). In such an example, the simulation generation component 1040 may identify a simulation computing device of the computing devices 1034 configured with a same version of the GPU that is associated with the control version of the controller.

Memory 1018 and 1032 are examples of non-transitory computer-readable media. The memory 1018 and 1032 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 1018 and 1032 may include at least a working memory and a storage memory. For example, the working memory may be a high-speed memory of limited capacity (e.g., cache memory) that is used for storing data to be operated on by the processor(s) 1016 and 1052. In some instances, the memory 1018 and 1032 may include a storage memory that may be a lower-speed memory of relatively large capacity that is used for long-term storage of data. In some cases, the processor(s) 1016 and 1052 cannot operate directly on data that is stored in the storage memory, and data may need to be loaded into a working memory for performing operations based on the data, as discussed herein.

It should be noted that while FIG. 10 is illustrated as a distributed system, in alternative examples, components of the vehicle 1002 may be associated with the computing device(s) 1034 and/or components of the computing device(s) 1034 may be associated with the vehicle 1002. That is, the vehicle 1002 may perform one or more of the functions associated with the computing device(s) 1034, and vice versa.

FIGS. 11-14 illustrate example processes in accordance with embodiments of the disclosure. These processes are illustrated as logical flow graphs, each operation of which represents a sequence of operations that may be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations may be combined in any order and/or in parallel to implement the processes.

Figure 11:
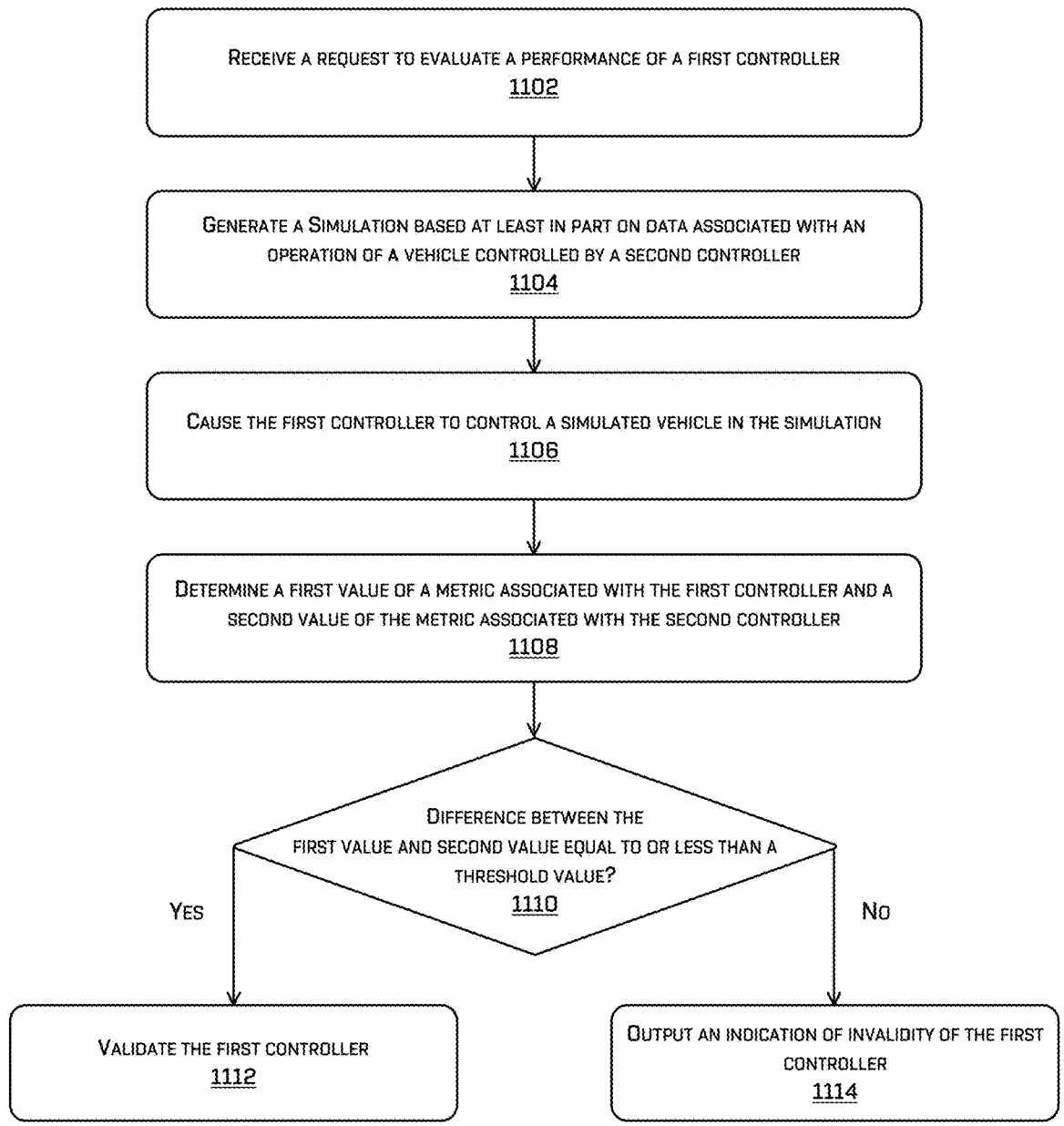
FIG. 11 depicts an example process for determining whether to validate a controller based on a metric associated with a simulation, in accordance with examples of this disclosure.

FIG. 11 depicts an example process 1100. Some or all of the process 1100 may be performed by one or more components in FIG. 10, as described herein. For example, some or all of the process 1100 may be performed by the vehicle computing device(s) 1004 and/or computing device(s) 1034.

At operation 1102, the process 1100 includes receiving a request to evaluate a performance of a first controller. The first controller may include an updated controller. In at least one example, the first controller may include an update (e.g., software update, modification, etc.) to a second controller, such as an on-vehicle controller configured to control a vehicle in operation in an environment. Though illustrated as a request to validate the first controller, this is not intended to be so limiting, and the request may include a request to validate a particular component and/or subcomponent of the first controller. For example, a software developer may refactor a code associated with a planner component. The software developer may thus submit a request to validate the planner component of the first controller, such as to verify that the planner functions as expected.

In various examples, the request may be received via a user interface. The user interface may be associated with the simulation computing system and/or a user computing device, such as one or more computing devices 1034. In some examples, the user interface may be accessible via an application (e.g., web-based application, native application, etc.), such as simulation application 1044 through which the simulation computing system may receive the request.

At operation 1104, the process 1100 includes generating a simulation based at least in part on data associated with an operation of a vehicle controller by the second controller. The data may include sensor data captured by one or more sensors on the vehicle and/or one or more remote sensors (e.g., on another vehicle, mounted in the environment, etc.), map data (e.g., one or more road segments associated with the environment and/or a vehicle path there-through), determined actions by which a controller (e.g., local or remote operator, active autonomous controller, etc.) controlled the vehicle through the environment, times associated with the actions, and the like. As discussed above, in various examples, the second controller may include a version of a controller or component (or subcomponent) thereof that is incorporated on-vehicle, such as that the second controller is configured to control operations of the vehicle from an initial location to a destination. In various examples, the second controller may include a version of the controller that is not incorporated on-vehicle but is used as a control version of the controller for validation.

In various examples, the simulation computing system generates the simulation based on a version of one or more hardware components associated with a vehicle computing system on which the second autonomous controller (e.g., control version of the controller) operates. In at least one example, the simulation computing system determines a version of a graphics processing unit (GPU) associated with the vehicle computing system. In various examples, the simulation computing system generates the simulation in association with a same version of the GPU as that associated with the vehicle computing system (and/or the second controller).

In various examples, the simulation computing system may generate the simulation based at least in part on one or more scenarios associated with the previous operation of the vehicle. As discussed above, the scenario(s) may include a pre-determined set of scenarios, such as those determined by the simulation computing system. In some examples, the scenario(s) may include one or more scenario(s) input by the user, such as for use in evaluation of the first controller. In some examples, the scenario(s) may be determined based on an indication of selection of a particular pre-determined set of scenarios. In various examples, the scenarios may be selected based on the component and/or configuration to be tested. In various examples, a number and/or percentage of scenarios may be limited based on the pre-determined list and/or based on user input, such as that described above.

At operation 1106, the process 1100 includes causing the first controller to control a simulated vehicle in the simulation. The first controller may control the simulated vehicle through the scenarios associated with the simulation. In various examples, the simulation computing system determines performance metrics associated with the performance of the first controller controlling the simulated vehicle in the simulation. As discussed above, the metrics may be associated with one or more performance attributes of the controller and/or associated with a particular component and/or configuration. In various examples, the simulation computing system may determine the metrics associated with the performance of the first controller at periodic time intervals (e.g., 0.05 seconds, 0.1 second, 0.2 seconds, etc.) throughout the simulation (e.g., in each scenario).

In various examples, the simulation computing system may additionally determine the metrics associated with the performance attributes of the second controller (e.g., associated with a previous operation of the vehicle). In various examples, the simulation computing system may receive the metrics from a vehicle computing system, such as with the data received above, in a periodic upload of data, or the like. In some examples, the simulation computing system may receive the metrics from the vehicle computing system in real-time or near-real time during the operation of the vehicle as controlled by the second controller. In such examples, the simulation computing system may store the metrics associated with the performance attributes of the second controller. In various examples, the simulation computing system may store the metrics associated with the second controller controlling the vehicle (e.g., actions determined, time to determine an action, number of actions considered, velocities, accelerations, etc.) in a datastore associated with the simulation computing system.

At operation 1108, the process 1100 includes determining a first value of a metric associated with the first controller and a second value of the metric associated with the second controller. In various examples, the first value of the first metric and the second value of the second metric may be associated with a same timestamp (e.g., tick).

At operation 1110 the process 1100 includes determining whether a difference between the first value of the metric and the second value of the metric is equal to or less than a threshold value. In various examples, the threshold value may be determined based on the performance attribute associated with the metric. In some examples, the threshold value may be determined based on a component and/or configuration of the controller associated with the metric.

Based on a determination that the difference is equal to or less than a threshold value ("Yes" at operation 1110), the process 1100, at operation 1112 includes validating the first controller. In various examples, the simulation computing system may output an indication of validity, such as indication of validity 152, for view by a user associated with the simulation computing system. In some examples, the simulation computing system may cause the indication of validity to be presented via a user interface, such as user interface 112. In various examples, based on a validation of the first controller, the simulation computing system may cause the first controller to be transmitted to one or more vehicles, such as to be incorporated into one or more vehicle computing systems associated therewith for controlling vehicle operations. In various examples, the simulation computing system may additionally cause results (e.g., metrics, differences, etc.) associated with the evaluation to be provided to the user, such as via the user interface or via a document, report, or the like.

Based on a determination that the difference is greater than a threshold value ("No" at operation 1110), the process 1100, at operation 1114 includes outputting an indication of invalidity of the first controller. In some examples, the simulation computing system may cause the indication of invalidation to be presented via the user interface. In various examples, the simulation computing system may additionally cause results (e.g., metrics, differences, etc.) associated with the evaluation to be provided to the user, such as via the user interface or via a document, report, or the like.

Figure 12:
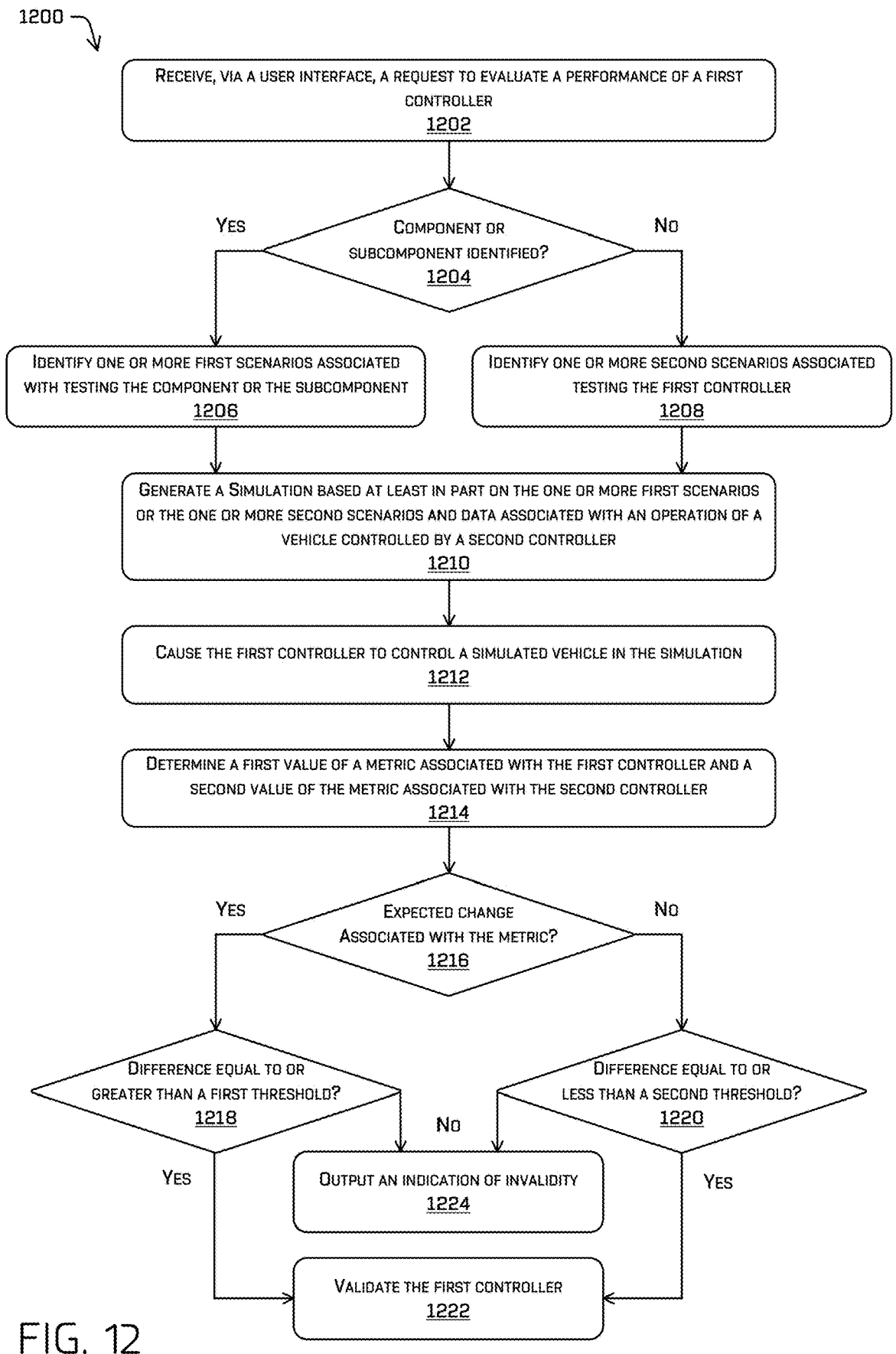
FIG. 12 depicts an example process for determining whether to validate an update to a component or a subcomponent of a controller based on determined metrics in a simulation, in accordance with examples of this disclosure.

FIG. 12 depicts an example process 1200. Some or all of the process 1200 may be performed by one or more components in FIG. 10, as described herein. For example, some or all of the process 1200 may be performed by the vehicle computing device(s) 1004 and/or computing device(s) 1034.

At operation 1202, the process 1200 includes receiving a request to evaluate a performance of a first controller. The first controller may include an updated controller. In various examples, the request may be received via a user interface. The user interface may be associated with the simulation computing system and/or a user computing device, such as one or more computing devices 1034. In some examples, the user interface may be accessible via an application (e.g., web-based application, native application, etc.), such as simulation application 1044 through which the simulation computing system may receive the request.

At operation 1204, the process 1200 includes determining whether a component or subcomponent associated with the first controller is identified in the request. In some examples, a performance evaluation may be limited to testing a particular component or subcomponent of the first controller, such as to expedite the evaluation process. In some examples, the user may indicate the component or subcomponent to be tested in the request, such as that submitted via the user interface.

Based on a determination that a component and/or subcomponent is identified ("Yes" at operation 1204), the process, at operation 1206 includes identifying one or more first scenarios associated with testing the component and/or subcomponent. In some examples, the first scenario(s) may be determined based on user input via a user interface, such as a user-provided set of scenarios, a selection of a pre-determined set of scenarios, or the like. In some examples, the simulation computing system determines the first scenario(s) based on maximizing a number of actions and/or sub-goals associated with the identified component and/or subcomponent, as described above.

Based on a determination that a component and/or subcomponent is not identified ("No" at operation 1204), the process 1200, at operation 1208, includes identifying one or more second scenarios associated with testing the first controller. The second scenario(s) may include a pre-determined list of scenarios. In some examples, the simulation computing system may identify the second scenario(s) based on user input, such as that described above.

At operation 1210, the process 1200 includes generating a simulation based at least in part on the one or more first scenarios or the one or more second scenarios and data associated with an operation of a vehicle controller by the second controller. The data may include sensor data captured by one or more sensors on the vehicle and/or one or more remote sensors (e.g., on another vehicle, mounted in the environment, etc.), map data (e.g., one or more road segments associated with the environment and/or a vehicle path there-through), determined actions by which a controller (e.g., local or remote operator, active autonomous controller, etc.) controlled the vehicle through the environment, times associated with the actions, and the like.

In various examples, the simulation computing system generates the simulation based on a version of one or more hardware components associated with a vehicle computing system on which the second autonomous controller (e.g., control version of the controller) operates. In at least one example, the simulation computing system determines a version of a graphics processing unit (GPU) associated with the vehicle computing system. In various examples, the simulation computing system generates the simulation in association with a same version of the GPU as that associated with the vehicle computing system (and/or the second controller).

At operation 1212, the process 1200 includes causing the first controller to control a simulated vehicle in the simulation. The first controller may control the simulated vehicle through the one or more first scenarios or the one or more second scenarios associated with the simulation. In various examples, the simulation computing system determines performance metrics associated with the performance of the first controller controlling the simulated vehicle in the simulation. As discussed above, the metrics may be associated with one or more performance attributes of the controller and/or associated with a particular component and/or configuration. In various examples, the simulation computing system may determine the metrics associated with the performance of the first controller at periodic time intervals (e.g., 0.05 seconds, 0.1 second, 0.2 seconds, etc.) throughout the simulation (e.g., in each scenario).

In various examples, the simulation computing system may additionally determine the metrics associated with the performance attributes of the second controller (e.g., associated with a previous operation of the vehicle). In various examples, the simulation computing system may receive the metrics from a vehicle computing system, such as with the data received above, in a periodic upload of data, or the like. In some examples, the simulation computing system may receive the metrics from the vehicle computing system in real-time or near-real time during the operation of the vehicle as controlled by the second controller. In such examples, the simulation computing system may store the metrics associated with the performance attributes of the second controller. In various examples, the simulation computing system may store the metrics associated with the second controller controlling the vehicle (e.g., actions determined, time to determine an action, number of actions considered, velocities, accelerations, etc.) in a datastore associated with the simulation computing system.

At operation 1214, the process 1200 includes determining a first value of a metric associated with the first controller and a second value of the metric associated with the second controller. In various examples, the first value of the first metric and the second value of the second metric may be associated with a same timestamp (e.g., tick).

At operation 1216, the process 1200 includes determining whether an expected change in value is associated with the metric. In some examples, the expected change in value may be determined based on a particular component or subcomponent modified and/or to be tested. In some examples, the expected change may be determined based on a user input associated with the one or more first scenarios. In some examples, the expected change may be determined based on an indication of a behavioral change to a component (or code thereof) of the first controller. The behavioral change may include a change associated with a trajectory, drive system, or other control of the vehicle (or simulated vehicle). For example, a behavioral change to a component may include updating the first controller to yield in a scenario in which the second controller does not yield (e.g., make the first controller more conservative). For another example, the expected change may include an increase in a number of a particular action or sub-goal exercised by the first controller, such as based on an update thereto Based on a determination that the change is expected ("Yes" at operation 1216), the process, at operation 1218 includes determining whether a difference between the first value and the second value is equal to or greater than a first threshold. The first threshold may be associated with the expected change (e.g., an improvement).

Based on a determination that the change is expected ("No" at operation 1216), the process, at operation 1220 includes determining whether the difference between the first value and the second value is equal to or less than a second threshold value. In various examples, the threshold value may be determined based on the performance attribute associated with the metric. In some examples, the threshold value may be determined based on a component and/or configuration of the controller associated with the metric.

Based on a determination that the that the difference is equal to or greater than the first threshold ("Yes" at operation 1218) or is equal to or less than the second threshold ("Yes" at operation 1220), the process, at operation 1222 includes validating the first controller. In various examples, the simulation computing system may output an indication of validity, such as indication of validity 152, for view by a user associated with the simulation computing system. In some examples, the simulation computing system may cause the indication of validity to be presented via a user interface, such as user interface 112. In various examples, based on a validation of the first controller, the simulation computing system may cause the first controller to be transmitted to one or more vehicles, such as to be incorporated into one or more vehicle computing systems associated therewith for controlling vehicle operations. In various examples, the simulation computing system may additionally cause results (e.g., metrics, differences, etc.) associated with the evaluation to be provided to the user, such as via the user interface or via a document, report, or the like.

Based on a determination that the that the difference is less than the first threshold ("No" at operation 1218) or is greater than the second threshold ("No" at operation 1220), the process, at operation 1224 includes outputting an indication of invalidity. In some examples, the simulation computing system may cause the indication of invalidity to be presented via the user interface. In various examples, the simulation computing system may additionally cause results (e.g., metrics, differences, etc.) associated with the evaluation to be provided to the user, such as via the user interface or via a document, report, or the like.

Figure 13:
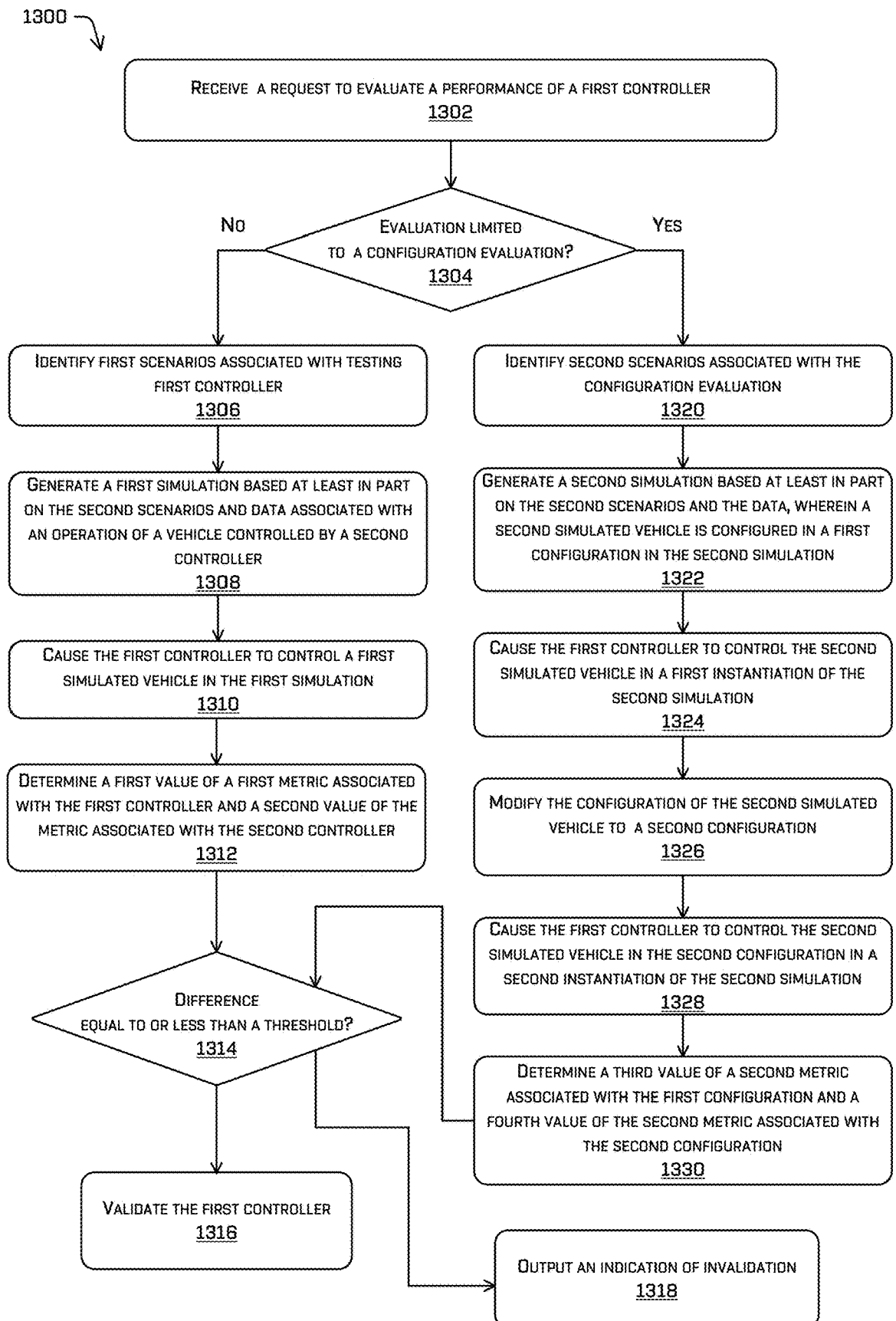
FIG. 13 depicts an example process for determining whether to validate a controller based at least in part on a metric associated with a configuration of the vehicle, in accordance with examples of this disclosure.

FIG. 13 depicts an example process 1300. Some or all of the process 1300 may be performed by one or more components in FIG. 10, as described herein. For example, some or all of the process 1300 may be performed by the vehicle computing device(s) 1004 and/or computing device(s) 1034.

At operation 1302, the process 1300 includes receiving a request to evaluate a performance of a first controller. The first controller may include an updated controller. In at least one example, the first controller may include an update (e.g., software update, modification, etc.) to a second controller, such as an on-vehicle controller configured to control a vehicle in operation in an environment. In various examples, the request may be received via a user interface. The user interface may be associated with the simulation computing system and/or a user computing device, such as one or more computing devices 1034. In some examples, the user interface may be accessible via an application (e.g., web-based application, native application, etc.), such as simulation application 1044 through which the simulation computing system may receive the request.

At operation 1304, the process 1300 includes determining whether the evaluation is limited to a configuration evaluation. The configuration evaluation may include an evaluation of the first controller to control a simulated vehicle in two or more different configurations. In at least one examples, the configuration evaluation may include an evaluation of the first controller to control the simulated vehicle in a first configuration associated with two-wheel steering and a second configuration associated with four-wheel steering. In some examples, the request to evaluate the configuration may be submitted via the user interface, such as via a configuration evaluation selectable option, such as configuration evaluation selectable option configured to enable a user to limit the evaluation of the first controller to a performance thereof related to two or different configurations.

Based on a determination that the evaluation is not limited to the configuration evaluation ("No" at operation 1304), the process 1300, at operation 1306 includes identifying first scenarios associated with testing the first controller. As discussed above, the first scenarios may be determined based on a pre-determined set of scenarios, a user input (e.g., specific set of scenarios, specific type of scenarios, etc.), a component or subcomponent associated with the request, or the like.

At operation 1308, the process 1300 includes generating a first simulation based at least in part on the first scenarios and data associated with an operation of a vehicle controlled by a second controller. The simulation computing system may generate the first simulation utilizing techniques described above, such as with respect to operation 122 of FIG. 1, 1104 of FIG. 11, and/or 1210 of FIG. 12.

At operation 1310, the process 1300 includes causing the first controller to control a simulated vehicle in the simulation. The simulation computing system may cause the first controller to control the simulated vehicle in the simulation utilizing techniques described above, such as with respect to operation 134 of FIG. 1, 1106 of FIG. 11, and/or 1212 of FIG. 12.

At operation 1312, the process 1300 includes determining a first value of a first metric associated with the first controller and a second value of the first metric associated with the second controller. The simulation computing system may determine the first value and the second value utilizing techniques described above, such as with respect to operation 138 of FIG. 1, 1108 of FIG. 11, and/or 1214 of FIG. 12.

At operation 1314, the process 1300 includes determining whether a difference between the first value of the first metric and the second value of the first metric is equal to or less than a threshold value. In various examples, the threshold value may be determined based on the performance attribute associated with the metric. In some examples, the threshold value may be determined based on a component and/or configuration of the controller associated with the metric.

Based on a determination that the difference is equal to or less than a threshold value ("Yes" at operation 1314), the process 1300, at operation 1316, includes validating the first controller. In various examples, the simulation computing system may output an indication of validity, such as indication of validity 152, for view by a user associated with the simulation computing system. In some examples, the simulation computing system may cause the indication of validity to be presented via a user interface, such as user interface 112. In various examples, based on a validation of the first controller, the simulation computing system may cause the first controller to be transmitted to one or more vehicles, such as to be incorporated into one or more vehicle computing systems associated therewith for controlling vehicle operations. In various examples, the simulation computing system may additionally cause results (e.g., metrics, differences, etc.) associated with the evaluation to be provided to the user, such as via the user interface or via a document, report, or the like.

Based on a determination that the difference is greater than a threshold value ("No" at operation 1314), the process 1300, at operation 1318 includes outputting an indication of invalidity of the first controller. In some examples, the simulation computing system may cause the indication of invalidation to be presented via the user interface. In various examples, the simulation computing system may additionally cause results (e.g., metrics, differences, etc.) associated with the evaluation to be provided to the user, such as via the user interface or via a document, report, or the like.

Based on a determination that the evaluation is limited to the configuration evaluation ("Yes" at operation 1304), the process 1300, at operation 1320, includes identifying second scenarios associated with the configuration evaluation. The simulation computing system may determine the second scenarios based on a particular type of configuration associated with the evaluation. For example, the simulation computing system may be configured to evaluate the performance of the first controller in a first configuration associated with two-wheel steering and the performance of the first controller in a second configuration associated with four-wheel steering, such as to ensure the controller performance is substantially the same (e.g., within a threshold) in each configuration. The simulation computing system may determine the set of scenarios based on scenarios that include tight turns, such as to stress the functionality of the steering component in controlling the vehicle around double-parked vehicles, maneuvering to avoid a jaywalker, and the like.

At operation 1322, the process 1300 includes generating a second simulation based at least in part on the second scenarios and the data, wherein a second simulated vehicle is configured in a first configuration in a first instantiation of the second simulation. In at least one example, the first configuration includes a two-wheel steering configuration. In various examples, the simulation computing system may generate the second simulation utilizing techniques described above and/or described in references incorporated herein above.

At operation 1324, the process 1300 includes causing the first controller to control the second simulated vehicle in a first instantiation of the second simulation. The first instantiation of the second simulation may include a version of the second simulation in which the second simulated vehicle is configured according to the first configuration. In various examples, the simulation computing system may store data (e.g., metrics) associated with the first controller controlling the second simulated vehicle in the first instantiation of the second simulation.

At operation 1326, the process 1300 includes modifying the configuration of the second simulated vehicle to a second configuration. In at least one example, the second configuration includes a four-wheel steering configuration.

At operation 1328, the process 1300 includes causing the first controller to control the second simulated vehicle in a second instantiation of the second simulation. second first instantiation of the second simulation may include a version of the second simulation in which the vehicle is configured according to the second configuration. In various examples, the simulation computing system may store data (e.g., metrics) associated with the first controller controlling the second simulated vehicle in the second instantiation of the second simulation.

At operation 1330, the process 1300 include determining a third value of a second metric associated with the first configuration and a fourth value of the second metric associated with the second configuration.

Based on a determination of the third value and the fourth value of the second metric, the simulation computing system may determine whether a difference between the third value and the fourth value is equal to or less than a threshold value, such as that described with regard to operation 1314. The threshold value associated with the second metric may include a same or a different threshold value as that associated with the first metric. In various examples, the simulation computing system may determine the threshold value associated with the second metric based on a performance attribute associated therewith.

Based on a determination that the difference between the third value and the fourth value is equal to or less than the threshold value ("Yes" at operation 1314), the process 1300, at operation 1316, includes validating the first controller in the configuration evaluation.

Based on a determination that the difference between the third value and the fourth value is greater than a threshold value ("No" at operation 1314), the process 1300, at operation 1318 includes outputting an indication of invalidity of the first controller with respect to the configuration evaluation.

Figure 14:
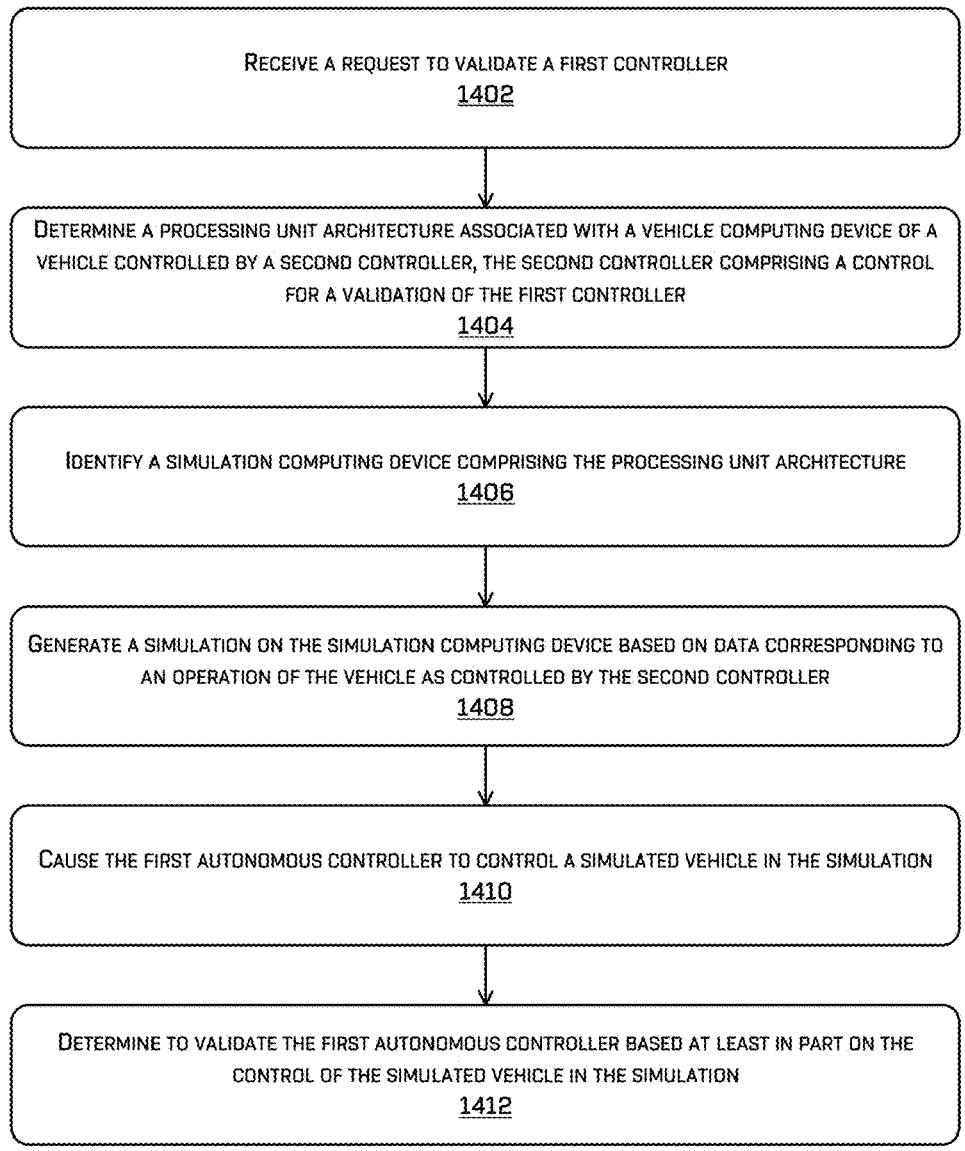
FIG. 14 depicts an example process for generating a simulation for testing a controller based at least in part on a processing unit associated with a control vehicle computing system corresponding to a control autonomous controller, in accordance with examples of this disclosure.

FIG. 14 depicts an example process 1400. Some or all of the process 1400 may be performed by one or more components in FIG. 10, as described herein. For example, some or all of the process 1400 may be performed by the vehicle computing device(s) 1004 and/or computing device(s) 1034.

At operation 1402, the process 1400 includes receiving a request to validate a first controller. The first controller may include an updated controller. In at least one example, the first controller may include an update (e.g., software update, modification, etc.) to a second controller, such as an on-vehicle controller configured to control a vehicle in operation in an environment. In various examples, the request may be received via a user interface. The user interface may be associated with the simulation computing system and/or a user computing device, such as one or more computing devices 1034. In some examples, the user interface may be accessible via an application (e.g., web-based application, native application, etc.), such as simulation application 1044 through which the simulation computing system may receive the request.

At operation 1404, the process 1400 includes determining a processing unit architecture associated with a vehicle computing device of a vehicle controlled by a second controller, the second controller comprising a control for a validation of the first controller. In at least one example, the processing unit architecture includes a version of a GPU utilized by the vehicle computing device, such as for graphics processing and other functionality.

At operation 1406, the process 1400 includes identifying a simulation computing device comprising the processing unit architecture. In at least one example, the simulation computing device may include a same version of the GPU.

At operation 1408, the process 1400 includes generating a simulation on the simulation computing device based on data corresponding to an operation of a vehicle controller by the second controller. The data may include sensor data captured by one or more sensors on the vehicle and/or one or more remote sensors (e.g., on another vehicle, mounted in the environment, etc.), map data (e.g., one or more road segments associated with the environment and/or a vehicle path there-through), determined actions by which a controller (e.g., local or remote operator, active autonomous controller, etc.) controlled the vehicle through the environment, times associated with the actions, and the like.

In various examples, the simulation computing system may generate the simulation based at least in part on one or more scenarios associated with the previous operation of the vehicle. As discussed above, the scenario(s) may include a pre-determined set of scenarios, such as those determined by the simulation computing system. In some examples, the scenario(s) may include one or more scenario(s) input by the user, such as for use in evaluation of the first controller. In some examples, the scenario(s) may be determined based on an indication of selection of a particular pre-determined set of scenarios. In various examples, the scenarios may be selected based on the component and/or configuration to be tested. In various examples, a number and/or percentage of scenarios may be limited based on the pre-determined list and/or based on user input, such as that described above.

At operation 1410, the process 1400 includes causing the first controller to control a simulated vehicle in the simulation. The first controller may control the simulated vehicle through the scenarios associated with the simulation. In various examples, the simulation computing system determines performance metrics associated with the performance of the first controller controlling the simulated vehicle in the simulation.

At operation 1412, the process 1400 includes determining to validate the first controller based at least in part on the control of the simulated vehicle in the simulation. In some examples, the simulation computing system determines to validate the first controller based on a determination that the first controller controls the simulated vehicle in a first configuration substantially the same (e.g., within a threshold performance, one or more threshold values, etc.).

In some examples, the simulation computing system determines to validate the first controller based on comparing values of first metrics corresponding to performance attributes of the first controller controlling the simulated vehicle and second values corresponding to performance attributes of the second controller controlling the vehicle. In various examples, the determination to validate may be based on a determination that a threshold number of first values are within a threshold value of the second values.

In various examples, the simulation computing system may output an indication of validity, such as indication of validity 152, for view by a user associated with the simulation computing system. In some examples, the simulation computing system may cause the indication of validity to be presented via a user interface, such as user interface 112. In various examples, based on a validation of the first controller, the simulation computing system may cause the first controller to be transmitted to one or more vehicles, such as to be incorporated into one or more vehicle computing systems associated therewith for controlling vehicle operations. In various examples, the simulation computing system may additionally cause results (e.g., metrics, differences, etc.) associated with the evaluation to be provided to the user, such as via the user interface or via a document, report, or the like.

Example Clauses

A: A system comprising: one or more processors; and memory storing processor-executable instructions that, when executed by the one or more processors, configure the system to: receive data associated with an operation of a vehicle in an environment, wherein the vehicle is at least partially controlled by a first autonomous controller during the operation; receive a request to evaluate a performance of a second autonomous controller; responsive to receiving the request, generate a simulation based at least in part on the data; cause the second autonomous controller to control a simulated vehicle in the simulation; determine, based at least in part on the operation of the vehicle, a first value of a metric associated with the first autonomous controller controlling the vehicle, the metric being associated with a state or operation of the vehicle; determine, based at least in part on an operation of the simulated vehicle, a second value of the metric associated with the second autonomous controller controlling the simulated vehicle; determine that a difference between a first value and the second value is equal to or less than a threshold value; and determining a validity of the second autonomous controller based at least in part on the difference.

B: The system of paragraph A, wherein difference exceeds the threshold value, wherein the instructions further configure the system to output an indication of invalidation of the second autonomous controller.

C: The system of either paragraph A or paragraph B, wherein the request comprises an indication of a subcomponent of the second autonomous controller to evaluate, wherein the instructions further configure the system to: identify a function associated with the subcomponent; determine a scenario associated with the function; and generate the simulation based at least in part on the function and the scenario.

D: The system of paragraph C, wherein the vehicle is controlled by a two-wheel steering, and wherein the subcomponent to evaluate comprises a four-wheel steering subcomponent.

E: The system of any one of paragraphs A-D, wherein the instructions further configure the system to: transmit the second autonomous controller to a vehicle computing device associated with the vehicle based at least in part on the validity.

F: A method comprising: receiving a request to evaluate a performance of a first controller; causing the first controller to control a simulated vehicle in a simulation; determine a first metric associated with controlling the simulated vehicle in accordance with the first controller; causing a second controller to control the simulated vehicle in the simulation; determine a second metric associated with controlling the simulated vehicle in accordance with the second controller; determining a difference between a first metric and a second metric; and determining a validation of the first controller based at least in part on the difference.

G: The method of paragraph F, wherein the difference exceeds the threshold value and the instructions further configure the system to output an indication of invalidation of the first controller.

H: The method of either paragraphs F or paragraph G, wherein the request comprises an indication of a subcomponent of the second autonomous controller to evaluate, the method further comprising: identifying a function associated with the subcomponent; determining a scenario associated with the function; and generating the simulation based at least in part on the function and the scenario.

I: The method of any one of paragraphs F-H, wherein the request comprises an indication that a component or subcomponent is being updated, the method further comprising: identifying an attribute associated with the component or the subcomponent, wherein the simulation is determined based at least in part on the attribute, and wherein the difference is indicative of the first metric being less than or equal to the second metric.

J: The method of any one of paragraphs F-I, wherein the metric is associated with at least one of an action associated with the operation of the vehicle; a time associated with the action; a number of actions considered; a trajectory associated with the action; a number of points associated with a corridor corresponding to a path of the vehicle; a steering angle of the vehicle; an angular rate associated with steering the vehicle; a location of the vehicle; a position of the vehicle; a velocity of the vehicle; an acceleration of the vehicle; or a drive gear of the vehicle.

K: The method of any one of paragraphs F-J, wherein the request comprises an indication that a behavior of the vehicle is independent of the first controller, and wherein determining the validation comprises determining that the difference is less than or equal to a threshold difference.

L: The method of any one of paragraphs F-K, further comprising: determining a processing unit architecture associated with a vehicle computing device of the vehicle controlled by the second controller; identifying a simulation computing device comprising the processing unit architecture; and generating the simulation on the simulation computing device.

M: The method of any one of paragraphs F-L, wherein the simulation is one of a plurality of simulations, an additional simulation of the plurality of simulations comprising an additional difference, the method further comprising: determining a number of differences that meet or exceed the threshold difference; and determining the validity based on the number of differences.

N: The method of paragraph M, wherein the component comprises at least one of: a perception component; a prediction component; a planner component; a tracker component; or a steering component.

O: A system or device comprising: one or more processors; and one or more non-transitory computer readable media storing instructions that, when executed, cause the one or more processors to perform a computer-implemented method as described in any one of paragraphs F-N.

P: A system or device comprising: a means for processing; and a means for storing coupled to the means for processing, the means for storing including instructions to configure one or more devices to perform a computer-implemented method as described in any one of paragraphs F-N.

Q: One or more non-transitory computer readable media storing instructions that, when executed, cause one or more processors to perform a method recited in any one of paragraphs F-N.

R: One or more non-transitory computer-readable media storing instructions that, when executed, cause one or more processors to perform operations comprising: receiving a request to evaluate a performance of a first controller; causing the first controller to control a simulated vehicle in a simulation; determine a first metric associated with controlling the simulated vehicle in accordance with the first controller; causing a second controller to control the simulated vehicle in the simulation; determine a second metric associated with controlling the simulated vehicle in accordance with the second controller; determining a difference between a first metric and a second metric; and performing at least one of: based at least in part on determining that the difference is equal to or less than a threshold value, validating the first controller; or based at least in part on determining that the difference exceeds the threshold value, outputting an indication of invalidation.

S: The one or more non-transitory computer-readable media of paragraph R, wherein the request comprises an indication of a subcomponent of the first controller to evaluate, and wherein the operations further comprise: identifying a function associated with the subcomponent; determining a scenario associated with the function; and generating the simulation based at least in part on the function and the scenario, wherein the indication of invalidation comprises an indication of an error associated with the subcomponent.

T: The one or more non-transitory computer-readable media of either paragraph R or paragraph S, the operations further comprising: determining a processing unit architecture associated with a vehicle computing device of the vehicle controlled by the second controller; identifying a simulation computing device comprising the processing unit architecture; and generating the simulation in association with the simulation computing device.

U: The one or more non-transitory computer-readable media of any one of paragraphs R-T, wherein the request comprises an indication that a behavior of the vehicle is independent of the first controller.

V: The one or more non-transitory computer-readable media of any one of paragraphs R-U, wherein the simulation is one of a plurality of simulations, an additional simulation of the plurality of simulations comprising an additional difference, and the operations further comprising: determining a number of differences that meet or exceed the threshold difference; and determining the validity based on the number of differences.

W: The one or more non-transitory computer-readable media of any one of paragraphs R-V, the operations further comprising: based at least in part on validating the first controller, transmitting the first controller to a vehicle computing device associated with the vehicle.

While the example clauses described above are described with respect to one particular implementation, it should be understood that, in the context of this document, the content of the example clauses may also be implemented via a method, device, system, a computer-readable medium, and/or another implementation. Additionally, any of examples A-W may be implemented alone or in combination with any other one or more of the examples A-W.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
one or more processors; and
one or more computer-readable media that, when executed by the one or more processors, cause the system to perform operations comprising:
receiving a request to evaluate a performance of a first controller causing the first controller to control a simulated vehicle in a simulation;
determining a first value of a metric associated with controlling the simulated vehicle in accordance with the first controller;
determining a second value of the metric associated with controlling the simulated vehicle based at least in part on data associated with an operation of a vehicle controlled by a second controller, wherein the second controller is different from the first controller;
determining that a difference between the first value and the second value is equal to or less than a threshold value;
determining a validity of the first controller based at least in part on the difference; and
transmitting, based at least in part on the validity, the first controller or the second controller to a vehicle computing device associated with the vehicle to control vehicle operations.

2. The system of claim 1, wherein the difference exceeds the threshold value, wherein the operations further comprise outputting an indication of invalidation of the first controller.

3. The system of claim 1, wherein the request comprises an indication of a subcomponent of the first controller to evaluate, wherein the operations further comprise:
identifying a function associated with the subcomponent;
determining a scenario associated with the function; and
generating the simulation based at least in part on the function and the scenario.

4. The system of claim 3, wherein the operations further comprise:
receiving the data associated with the operation of the vehicle in an environment, wherein the vehicle is at least partially controlled by the second controller during the operation, and wherein the vehicle is controlled by a two-wheel steering, and
wherein the subcomponent to evaluate comprises a four-wheel steering subcomponent.

5. A method comprising:
receiving a request to evaluate a performance of a first controller;
causing the first controller to control a simulated vehicle in a simulation;
determining a first metric associated with controlling the simulated vehicle in accordance with the first controller;
controlling the simulated vehicle in the simulation based at least in part on data associated with an operation of a vehicle controlled by a second controller, wherein the second controller is different from the first controller;
determining a second metric associated with controlling the simulated vehicle in accordance with the second controller;
determining a difference between the first metric and the second metric;
determining a validity of the first controller based at least in part on the difference; and
transmitting, based at least in part on the validity, the first controller or the second controller to a vehicle computing device associated with the vehicle to control vehicle operations.

6. The method of claim 5, wherein determining the validity comprises determining that the difference is less than or equal to a threshold difference, wherein the difference exceeds the threshold difference and the method further comprising outputting an indication of invalidation of the first controller.

7. The method of claim 5, wherein the request comprises an indication of a subcomponent of the first controller to evaluate, the method further comprising:
identifying a function associated with the subcomponent;
determining a scenario associated with the function; and
generating the simulation based at least in part on the function and the scenario.

8. The method of claim 5, wherein the request comprises an indication that a component or subcomponent is being updated, the method further comprising:
identifying an attribute associated with the component or the subcomponent,
wherein the simulation is determined based at least in part on the attribute, and
wherein the difference is indicative of the first metric being less than or equal to the second metric.

9. The method of claim 5, wherein the first metric or the second metric is associated with at least one of:
an action associated with an operation of the simulated vehicle;
a time associated with the action;
a number of actions considered;
a trajectory associated with the action;
a number of points associated with a corridor corresponding to a path of the simulated vehicle;
a steering angle of the simulated vehicle;
an angular rate associated with steering the simulated vehicle;
a location of the simulated vehicle;
a position of the simulated vehicle;
a velocity of the simulated vehicle;
an acceleration of the simulated vehicle; or
a drive gear of the simulated vehicle.

10. The method of claim 5, wherein the request comprises an indication that a behavior of the simulated vehicle is independent of the first controller, and
wherein determining the validity comprises determining that the difference is less than or equal to a threshold difference.

11. The method of claim 5, further comprising:
determining a processing unit architecture associated with the vehicle computing device of the vehicle controlled by the second controller;
identifying a simulation computing device comprising the processing unit architecture; and
generating the simulation on the simulation computing device.

12. The method of claim 5, wherein the simulation is one of a plurality of simulations, an additional simulation of the plurality of simulations comprising an additional difference, the method further comprising:
determining a number of differences that meet or exceed a threshold difference; and
determining the validity based on the number of differences.

13. The method of claim 12, wherein the request comprises an indication of a component of the first controller to evaluate, wherein the component comprises at least one of:
- a perception component;
- a prediction component;
- a planner component;
- a tracker component; or
- a steering component.

14. One or more non-transitory computer-readable media storing instructions that, when executed, cause one or more processors to perform operations comprising:
- receiving a request to evaluate a performance of a first controller;
- causing the first controller to control a simulated vehicle in a simulation;
- determining a first metric associated with controlling the simulated vehicle in accordance with the first controller;
- controlling the simulated vehicle in the simulation based at least in part on data associated with an operation of a vehicle controlled by a second controller, wherein the second controller is different from the first controller;
- determining a second metric associated with controlling the simulated vehicle in accordance with the second controller, wherein the second controller is different from the first controller;
- determining a difference between the first metric and the second metric;
- determining a validity of the first controller, wherein determining the validity of the first controller comprises at least one of:
  - based at least in part on determining that the difference is equal to or less than a threshold value, validating the first controller; or
  - based at least in part on determining that the difference exceeds the threshold value, outputting an indication of invalidation; and
- transmitting, based at least in part on the validity, the first controller or the second controller to a vehicle computing device associated with a vehicle to control vehicle operations.

15. The one or more non-transitory computer-readable media of claim 14, wherein the request comprises an indication of a subcomponent of the first controller to evaluate, and wherein the operations further comprise:
- identifying a function associated with the subcomponent;
- determining a scenario associated with the function; and
- generating the simulation based at least in part on the function and the scenario, wherein the indication of invalidation comprises an indication of an error associated with the subcomponent.

16. The one or more non-transitory computer-readable media of claim 14, the operations further comprising:
- determining a processing unit architecture associated with the vehicle computing device of the vehicle controlled by the second controller;
- identifying a simulation computing device comprising the processing unit architecture; and
- generating the simulation in association with the simulation computing device.

17. The one or more non-transitory computer-readable media of claim 14, wherein the request comprises an indication that a behavior of the simulated vehicle is independent of the first controller.

18. The one or more non-transitory computer-readable media of claim 14, wherein the simulation is one of a plurality of simulations, an additional simulation of the plurality of simulations comprising an additional difference, and the operations further comprising:
- determining a number of differences that meet or exceed a threshold difference; and
- determining the validity based on the number of differences.

19. The one or more non-transitory computer-readable media of claim 14, the operations further comprising:
- based at least in part on validating the first controller, transmitting the first controller to the vehicle computing device associated with the vehicle.

20. The system of claim 1, wherein the operations further comprise:
- receiving the data associated with the operation of the vehicle in an environment, wherein the vehicle is at least partially controlled by the second controller during the operation;
- responsive to receiving the request, generating a simulation based at least in part on the data, and
- wherein determining the first metric associated with controlling the simulated vehicle in accordance with the first controller comprises: determining the first value based at least in part on operation of the simulated vehicle using the data, and
- wherein determining the second metric associated with controlling the simulated vehicle in accordance with the second controller comprises: determining the second value based at least in part on the operation of the vehicle, wherein the second metric being associated with a state or the operation of the vehicle.

* * * * *